United States Patent
Tajima et al.

(10) Patent No.: US 10,283,633 B2
(45) Date of Patent: May 7, 2019

(54) SEMICONDUCTOR DEVICE AND METHOD FOR MANUFACTURING THE SAME

(71) Applicant: Kabushiki Kaisha Toshiba, Minato-ku (JP)

(72) Inventors: Jumpei Tajima, Mitaka (JP); Toshiki Hikosaka, Kawasaki (JP); Kenjiro Uesugi, Kawasaki (JP); Shigeya Kimura, Yokohama (JP); Masahiko Kuraguchi, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/899,925

(22) Filed: Feb. 20, 2018

(65) Prior Publication Data

US 2019/0088770 A1 Mar. 21, 2019

(30) Foreign Application Priority Data

Sep. 19, 2017 (JP) .................................. 2017-178780

(51) Int. Cl.
*H01L 29/778* (2006.01)
*H01L 29/66* (2006.01)
(Continued)

(52) U.S. Cl.
CPC ...... *H01L 29/7787* (2013.01); *H01L 21/3083* (2013.01); *H01L 29/1037* (2013.01);
(Continued)

(58) Field of Classification Search
CPC .......... H01L 29/7787; H01L 29/41775; H01L 29/2003; H01L 29/205; H01L 29/42356;
(Continued)

(56) References Cited

U.S. PATENT DOCUMENTS 5,701,016 A 12/1997 Burroughes et al.
7,491,983 B2 * 2/2009 Otsuka ................ H01L 29/7787
257/183

(Continued)

FOREIGN PATENT DOCUMENTS

JP 2001-196575 7/2001
JP 2006-054478 2/2006
(Continued)

*Primary Examiner* — David Vu
(74) *Attorney, Agent, or Firm* — Oblon, McClelland, Maier & Neustadt, L.L.P.

(57) ABSTRACT

According to one embodiment, a semiconductor device includes a first electrode, a second electrode, a third electrode, a first layer, a second layer, a third layer, and an insulating layer. A position of the third electrode is between a position of the first electrode and a position of the second electrode. The first layer includes at least one of $Al_{x1}Ga_{1-x1}N$ ($0<x1<1$) or p-type $Al_{z1}Ga_{1-z1}N$ ($0 \le z1 <1$) and has a first surface, a second surface, and a third surface. The second layer includes $Al_{x2}Ga_{1-x2}N$ ($0 \le x2 <1$ and $x2<x1$) and includes a first partial region, a second partial region, and a third partial region. The third layer includes $Al_{x3}Ga_{1-x3}N$ ($0<x3<1$ and $x2<x3$) and includes a fourth partial region, a fifth partial region, and a sixth partial region.

15 Claims, 20 Drawing Sheets

(51) Int. Cl.
*H01L 29/10* (2006.01)
*H01L 29/423* (2006.01)
*H01L 21/308* (2006.01)
*H01L 29/205* (2006.01)
*H01L 29/20* (2006.01)
*H01L 29/417* (2006.01)
*H01L 21/306* (2006.01)

(52) U.S. Cl.
CPC ........ *H01L 29/2003* (2013.01); *H01L 29/205* (2013.01); *H01L 29/41775* (2013.01); *H01L 29/42356* (2013.01); *H01L 29/66522* (2013.01); *H01L 21/30612* (2013.01); *H01L 21/30621* (2013.01)

(58) Field of Classification Search
CPC ........... H01L 29/1037; H01L 29/66522; H01L 21/3083; H01L 21/30612; H01L 21/30621
See application file for complete search history.

(56) References Cited

U.S. PATENT DOCUMENTS

| | | |
|---|---|---|
| 8,134,180 B2 | 3/2012 | Otake et al. |
| 2001/0020700 A1 | 9/2001 | Inoue et al. |
| 2016/0260827 A1 | 9/2016 | Nishimori et al. |

FOREIGN PATENT DOCUMENTS

| | | |
|---|---|---|
| JP | 2007-088185 | 4/2007 |
| JP | 2009-044006 | 2/2009 |
| JP | 2009-099774 | 5/2009 |
| JP | 2012-204577 | 10/2012 |
| JP | 2016-163017 | 9/2016 |

\* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2017-178780, filed on Sep. 19, 2017; the entire contents of which are incorporated herein by reference.

FIELD

Embodiments described herein relate generally to a semiconductor device and a method for manufacturing the same.

BACKGROUND

For example, there is a semiconductor device such as a transistor or the like that uses a nitride semiconductor. A normally-on semiconductor device is obtained by setting the threshold to be high.

DETAILED DESCRIPTION

Figure 1:
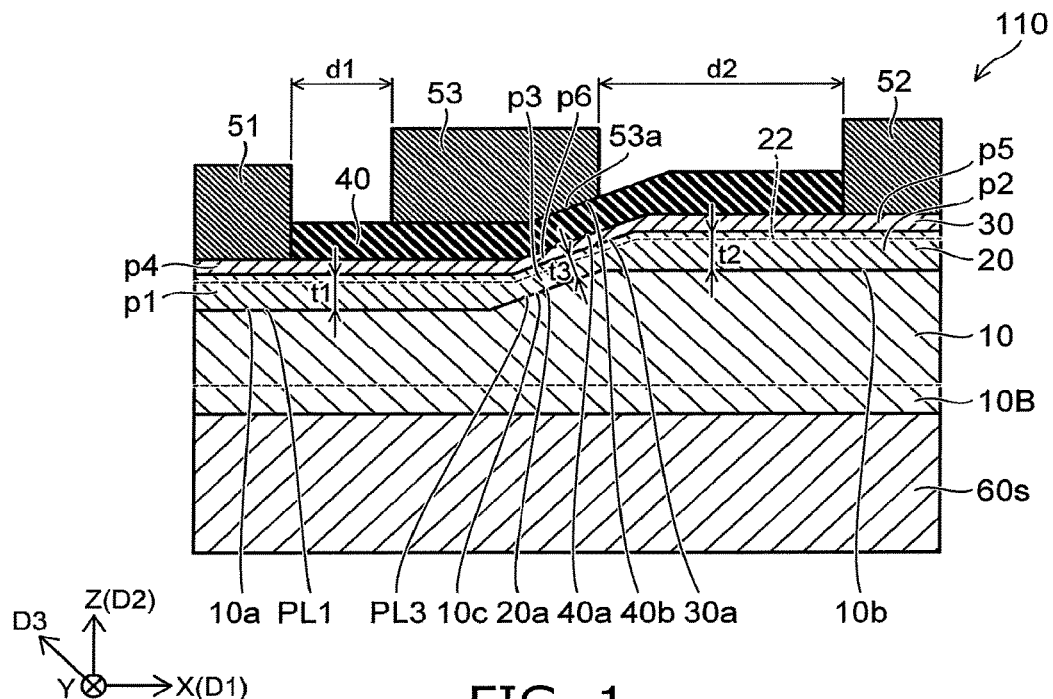
FIG. 1 is a schematic cross-sectional view illustrating a semiconductor device according to a first embodiment.

According to one embodiment, a semiconductor device includes a first electrode, a second electrode, a third electrode, a first layer, a second layer, a third layer, and an insulating layer. A position of the third electrode in a first direction is between a position of the first electrode in the first direction and a position of the second electrode in the first direction. The first layer includes at least one of $Al_{x1}Ga_{1-x1}N$ ($0<x1<1$) or p-type $Al_{z1}Ga_{1-z1}N$ ($0≤z1<1$) and has a first surface, a second surface, and a third surface. The first surface is separated from the first electrode in a second direction crossing the first direction. The second surface is separated from the second electrode in the second direction and aligned with a first plane including the first surface. The third surface is separated from the third electrode in the second direction and tilted with respect to the first plane. The second layer includes $Al_{x2}Ga_{1-x2}N$ ($0≤x2<1$ and $x2<x1$) and includes a first partial region, a second partial region, and a third partial region. The first partial region is provided between the first electrode and the first surface in the second direction. The second partial region is provided between the second electrode and the second surface in the second direction. The third partial region is provided between the third electrode and the third surface in the second direction. The third layer includes $Al_{x3}Ga_{1-x3}N$ ($0<x3<1$ and $x2<x3$) and includes a fourth partial region, a fifth partial region, and a sixth partial region. The fourth partial region is provided between the first electrode and the first partial region in the second direction. The fifth partial region is provided between the second electrode and the second partial region in the second direction. The sixth partial region is provided between the third electrode and the third partial region in the second direction. The fourth partial region is electrically connected to the first electrode. The fifth partial region is electrically connected to the second electrode. The insulating layer is provided between the third electrode and the sixth partial region in the second direction.

According to another embodiment, a semiconductor device includes a first electrode, a second electrode, a third electrode, a first layer, a second layer, a third layer, and an insulating layer. A position of the third electrode in a first direction is between a position of the first electrode in the first direction and a position of the second electrode in the first direction. The first layer includes a first semiconductor region including at least one of $Al_{y1}Ga_{1-y1}N$ ($0<y1<1$) or p-type $Al_{z1}Ga_{1-z1}N$ ($0≤z1<1$), a second semiconductor region including at least one of $Al_{y2}Ga_{1-y2}N$ ($0<y2<1$) or p-type $Al_{z2}Ga_{1-z2}N$ ($0≤z2<1$), and a third semiconductor region including $Al_{y3}Ga_{1-y3}N$ ($0≤y3<1$, $y3<y1$, and $y3<y2$). At least a portion of the second semiconductor region is positioned between the second electrode and a portion of the first semiconductor region in a second direction crossing the first direction. A portion of the third semiconductor region is positioned between the portion of the first semiconductor region and the at least a portion of the second semiconductor region in the second direction. Another portion of the third semiconductor region is positioned between the third electrode and another portion of the first semiconductor region in the second direction. The first semiconductor region has a first surface separated from the first electrode in the second direction. The second semiconductor region has a second surface separated from the second electrode in the second direction and aligned with a first plane including the first surface. The third semiconductor region has a third surface separated from the third electrode in the second direction and tilted with respect to the first plane. The second layer includes $Al_{x2}Ga_{1-x2}N$ ($0≤x2<1$, $x2<y1$, and $x2<y2$) and includes a first partial region, a second partial region, and a third partial region. The first partial region is provided between the first electrode and the first surface in the second direction. The second partial region is provided between the second electrode and the second surface in the second direction. The third partial region is provided between the third electrode and the third surface in the second direction. The third layer includes $Al_{x3}Ga_{1-x3}N$ ($0<x3<1$, $x2<x3$, and $y3<x3$) and includes a fourth partial region, a fifth partial region, and a sixth partial region. The fourth partial region is provided between the first electrode and the first partial region in the second direction. The fifth partial region is provided between the second electrode and the second partial region in the second direction. The sixth partial region is provided between the third electrode and the third partial region in the second direction. The fourth partial region is electrically connected to the first electrode. The fifth partial region is electrically connected to the second electrode. The insulating layer is provided between the third electrode and the sixth partial region in the second direction.

According to another embodiment, a method for manufacturing a semiconductor device is disclosed. The method can include forming a first layer including at least one of $Al_{x1}Ga_{1-x1}N$ ($0<x1<1$) or p-type $Al_{z1}Ga_{1-z1}N$ ($0≤z1<1$). The first layer has a first surface, a second surface, and a third surface. The second surface is aligned with a first plane including the first surface. The third surface is tilted with respect to the first surface. A position of the third surface in a first direction is between a position of the first surface in the first direction and a position of the second surface in the first direction. The first direction is aligned with the first surface. The method can include forming a second layer including $Al_{x2}Ga_{1-x2}N$ ($0≤x2<1$ and $x2<x1$) on the first layer, forming a third layer including $Al_{x3}Ga_{1-x3}N$ ($0<x3<1$ and $x2<x3$) on the second layer, and forming an insulating layer on a portion of the third layer. The portion of the third layer overlaps the third surface in a second direction crossing the first surface. The method can include forming a first electrode, a second electrode, and a third electrode. The first electrode overlaps the first surface in the second direction and is electrically connected to another portion of the third layer. The second electrode overlaps the second surface in the second direction and is electrically connected to yet another portion of the third layer. The third electrode is positioned on the insulating layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the first embodiment includes a first electrode 51, a second electrode 52, a third electrode 53, a first layer 10, a second layer 20, a third layer 30, and an insulating layer 40.

A substrate 60s (e.g., a silicon substrate) is provided in the example. The first layer 10 is provided on the substrate 60s. The second layer 20 is provided on the first layer 10. The third layer 30 is provided on the second layer 20. The first layer 10, the second layer 20, and the third layer 30 include nitride semiconductors.

For example, a buffer layer 10B (e.g., an AlGaN layer) may be provided on the substrate 60s. The first layer 10 is provided on the buffer layer 10B. Or, the buffer layer 10B may be a portion of the first layer 10.

The position of the third electrode 53 in a first direction D1 is between the position of the first electrode 51 in the first direction D1 and the position of the second electrode 52 in the first direction D1.

The first direction D1 is taken as an X-axis direction. A direction perpendicular to the X-axis direction is taken as a Z-axis direction. A direction perpendicular to the X-axis direction and the Z-axis direction is taken as a Y-axis direction.

The first layer 10 includes at least one of $Al_{x1}Ga_{1-x1}N$ ($0<x1<1$) or p-type $Al_{z1}Ga_{1-z1}N$ ($0 \leq z1<1$).

The first layer 10 includes, for example, AlGaN. In such a case, the composition ratio of Al is, for example, not less than 5 atm % (atomic percent) and not more than 40 atm %. The first layer 10 includes, for example, $Al_{0.2}Ga_{0.8}N$.

Or, the first layer 10 includes p-type GaN. The first layer 10 includes, for example, GaN including at least one of Mg, Zn, or C.

The first layer 10 is separated from these electrodes in the Y-axis direction. The first layer 10 has a first surface 10a, a second surface 10b, and a third surface 10c. These surfaces correspond respectively to, for example, three portions of the upper surface of the first layer 10.

The first surface 10a is separated from the first electrode 51 in a second direction D2. The second direction D2 crosses the first direction D1. In the example, the second direction D2 is the Z-axis direction. For example, the first surface 10a is aligned with the X-Y plane.

The second surface 10b is separated from the second electrode 52 in the second direction D2. The second surface 10b is aligned with a first plane PL1 including the first surface 10a. For example, the first plane PL1 is aligned with the X-Y plane.

The third surface 10c is separated from the third electrode 53 in the second direction D2. The third surface 10c is tilted with respect to the first plane PL1 (e.g., the X-Y plane).

The second layer 20 includes $Al_{x2}Ga_{1-x2}N$ ($0 \leq x2<1$ and $x2<x1$). The second layer 20 includes, for example, GaN.

The second layer 20 includes a first partial region p1, a second partial region p2, and a third partial region p3.

The first partial region p1 is provided between the first electrode 51 and the first surface 10a in the second direction D2 (e.g., the Z-axis direction). The second partial region p2 is provided between the second electrode 52 and the second surface 10b in the second direction D2. The third partial region p3 is provided between the third electrode 53 and the third surface 10c in the second direction D2. For example, these partial regions are continuous with each other.

The third layer 30 includes $Al_{x3}Ga_{1-x3}N$ ($0<x3<1$ and $x2<x3$). The third layer 30 includes, for example, AlGaN. The composition ratio of Al of the third layer 30 is, for example, not less than 5 atm % (atomic percent) and not more than 40 atm %. The third layer 30 includes, for example, $Al_{0.2}Ga_{0.8}N$.

The third layer 30 includes a fourth partial region p4, a fifth partial region p5, and a sixth partial region p6.

The fifth partial region p5 is provided between the first electrode 51 and the first partial region p1 in the second direction D2 (e.g., the Z-axis direction). The fifth partial region p5 is provided between the second electrode 52 and the second partial region p2 in the second direction D2. The sixth partial region p6 is provided between the third electrode 53 and the third partial region p3 in the second direction D2.

The fourth partial region p4 is electrically connected to the first electrode 51. The fifth partial region p5 is electrically connected to the second electrode 52.

The insulating layer 40 is provided between the third electrode 53 and the sixth partial region p6 in the second direction D2 (e.g., the Z-axis direction).

For example, the first electrode 51 is used as one of a source electrode or a drain electrode of the semiconductor device 110. The second electrode 52 is used as the other of the source electrode or the drain electrode. The third electrode 53 is used as the gate electrode of the semiconductor device 110. For example, the insulating layer 40 is used as the gate insulating film.

For example, the lattice constants are different between the second layer 20 and the third layer 30. In such a case, spontaneous polarization and piezoelectric polarization occur in the c-axis direction of the wurtzite-type crystal structure. Due to the spontaneous polarization and the piezoelectric polarization, a two-dimensional electron gas 22 (2DEG) occurs in the vicinity of the interface between the second layer 20 (e.g., the GaN) and the third layer 30 (e.g., the AlGaN). The two-dimensional electron gas 22 is used s a high mobility channel. The semiconductor device 110 is, for example, a high electron mobility transistor (HEMT).

The first layer 10 is provided in the semiconductor device 110. The first layer 10 includes AlGaN or p-type GaN. The first layer 10 functions as, for example, a back barrier layer.

In the semiconductor device 110, a portion (the third surface 10c) of the first layer 10 is tilted. Thereby, the polarization weakens in the region between the third surface 10c and the third electrode 53. Thereby, the threshold increases. According to the embodiment, a high threshold can be obtained.

On the other hand, a strong polarization acts at the vicinity of the first electrode 51 and the vicinity of the second electrode 52. Thereby, the resistance is reduced. A high threshold and a low on-resistance are obtained.

For example, the first plane PL1 (a plane including the first surface 10a) is aligned with the c-plane of the first layer 10. For example, the first surface 10a and the second surface 10b are aligned with the c-plane. On the other hand, the third surface 10c is tilted with respect to the c-plane.

For example, the absolute value of the angle between the first plane PL1 and the c-plane of the first layer 10 is less than the absolute value of the angle between the third surface 10c and the c-plane. For example, the absolute value of the angle between the first surface 10a and the c-plane is less than the absolute value of the angle between the third surface 10c and the c-plane. The absolute value of the angle between the second surface 10b and the c-plane is less than the absolute value of the angle between the third surface 10c and the c-plane.

For example, the absolute value of the angle between the first surface 10a and the c-plane of the first layer 10 is less than 5 degrees. The absolute value of the angle between the second surface 10b and the c-plane of the first layer 10 is less than 5 degrees. On the other hand, the absolute value of the angle between the third surface 10c and the c-plane of the first layer 10 is not less than 5 degrees and not more than 85 degrees.

For example, the third partial region p3 (the GaN-channel layer) of the second layer 20 also is tilted with respect to the c-plane. The sixth partial region p6 (the AlGaN barrier layer) of the third layer 30 also is tilted with respect to the c-plane. The polarization is weakened between the tilted GaN-channel layer and the tilted AlGaN barrier layer. Thereby, the threshold increases. As recited above, the threshold increases further due to the back barrier layer (the first layer 10) having the tilted third surface 10c.

In the region between the first electrode 51 and the third electrode 53 and the region between the second electrode 52 and the third electrode 53, the GaN-channel layer is horizontal; and the carrier density is high. Thereby, the resistance is low. The good characteristics of a normally-off characteristic (a high threshold) and a low on-resistance are obtained.

For example, the third electrode 53 has a third electrode surface 53a (e.g., the lower surface). The third electrode surface 53a opposes the insulating layer 40. The third electrode surface 53a is aligned with a third plane PL3 including the third surface 10c. Thus, the third electrode surface 53a (e.g., the lower surface) of the third electrode 53 also is tilted.

The insulating layer 40 has a first insulating layer surface 40a (e.g., the lower surface). The first insulating layer surface 40a opposes the third surface 10c. The first insulating layer surface 40a is aligned with the third plane PL3 including the third surface 10c. Thus, the first insulating layer surface 40a (e.g., the lower surface) of the insulating layer 40 also is tilted.

The insulating layer 40 has a second insulating layer surface 40b (e.g., the upper surface). The second insulating layer surface 40b opposes the third electrode 53. The second insulating layer surface 40b is aligned with the third plane PL3. Thus, the second insulating layer surface 40b (e.g., the upper surface) of the insulating layer 40 also is tilted.

The third layer 30 has a third layer surface 30a (e.g., the lower surface). The third layer surface 30a opposes the third surface 10c. The third layer surface 30a is aligned with the third plane PL3 including the third surface 10c. Thus, the third layer surface 30a (e.g., the lower surface) of the third layer 30 also is tilted.

The second layer 20 has a second layer surface 20a (e.g., the lower surface). The second layer surface 20a opposes the third surface 10c. The second layer surface 20a is aligned with the third plane PL3 including the third surface 10c.

In the example as shown in FIG. 1, the thickness of the second layer 20 of the tilted portion is thinner than the thicknesses of the other portions. For example, the thickness of the third partial region p3 is taken as a third thickness t3. The third thickness t3 is the length (the thickness) along a third direction D3. The third direction D3 is perpendicular to the third surface 10c. On the other hand, the thickness of the second partial region p2 is taken as a second thickness t2. The second thickness t2 is the length (the thickness) along the second direction D2 (the Z-axis direction). The third thickness t3 is thinner than the second thickness t2. The thickness of the first partial region p1 is taken as a first thickness t1. The first thickness t1 is the length (the thickness) along the first direction D1 (the Z-axis direction). The third thickness t3 is thinner than the first thickness t1.

These thicknesses are the widths (the lengths) in directions perpendicular to the direction in which the carriers flow. In the case where these thicknesses are thin, the carrier density decreases.

In the embodiment, the third thickness t3 is thinner than the first thickness t1 and thinner than the second thickness t2. Thereby, the threshold increases further.

In the embodiment as described above, the absolute value of the angle between the third surface 10c and the first plane PL1 including the first surface 10a is, for example, not less than 5 degrees and not more than 85 degrees. For example, the absolute value of the angle between the c-plane and the third surface 10c is, for example, not less than 5 degrees and not more than 85 degrees.

By such a tilted third surface 10c, the thickness (the third thickness t3) of the second layer 20 formed on the third surface 10c can be thinner than the thicknesses (e.g., the first thickness t1 or the second thickness t2) of the other portions.

In the embodiment, the first thickness t1 and the second thickness t2 each are, for example, not less than 100 nm and not more than 500 nm. The third thickness t3 is, for example, not less than 30 nm and not more than 200 nm.

In the case where the absolute value of the angle recited above is not less than 5 degrees and not more than 85 degrees, for example, the polarization can be reduced; and the tilted portion can be locally thin.

For example, the angle of the tilt can be controlled by the etching conditions, etc. In the example shown in FIG. 1, for example, the width along the tilted surface of the third electrode 53 is set to be 500 nm. For example, in the case where the angle of the tilt is 30 degrees, the height difference between the first surface 10a and the second surface 10b is 250 nm. For example, in the case where the angle of the tilt is 60 degrees, the height difference between the first surface 10a and the second surface 10b is 432 nm.

In the embodiment, for example, the thickness (the length (the thickness) in the direction perpendicular to the third surface 10c) of the sixth partial region p6 is thinner than the thickness (the length (the thickness) along the second direction D2 (the Z-axis direction)) of the fifth partial region p5. For example, the thickness of the sixth partial region p6 is thinner than the thickness (the length (the thickness) along the second direction D2 (the Z-axis direction)) of the fourth partial region p4.

In the embodiment, the thicknesses (the thicknesses along the Z-axis direction) of the portion including the first surface 10a of the first layer 10 and the portion including the second surface 10b of the first layer 10 are, for example, not less than 500 nm and not more than 5000 nm.

In the embodiment, the first thickness t1 of the second layer 20 is, for example, not less than 100 nm and not more than 500 nm. In the third layer 30, the thickness (the length along the second direction D2 (the Z-axis direction)) of the fourth partial region p4 is, for example, not less than 10 nm and not more than 100 nm.

For example, the thickness (the length along the third direction D3) of the sixth partial region p6 is thinner than the thickness (the length along the second direction D2) of the fourth partial region p4 and thinner than the thickness (the length along the second direction D2) of the fifth partial region p5.

For example, the first electrode 51 and the second electrode 52 have ohmic contacts with the third layer 30. These electrodes include, for example, stacked films of Au/Ni/Al/Ti, etc. The Ti contacts the third layer 30.

The third electrode 53 includes, for example, TiN. The third electrode 53 may include, for example, a metal having a high work function. The third electrode 53 may include a stacked film including a metal having a high work function.

The insulating layer 40 includes, for example, at least one of silicon oxide, aluminum oxide, silicon oxynitride, aluminum oxynitride, or silicon nitride. The insulating layer 40 may include multiple films including these materials.

In the example shown in FIG. 1, a first distance d1 along the first direction D1 (e.g., the X-axis direction) between the first electrode 51 and the third electrode 53 is shorter than a second distance d2 along the first direction D1 between the second electrode 52 and the third electrode 53. In one example, the first distance d1 is about 2 μm; and the second distance d2 is about 15 μm. Such a length relationship is more favorable because, for example, it is possible to set the electrical resistance on the first distance d1 side to be low and to apply a high electric field to the second distance d2 side. In the embodiment, the relationship of these distances may be reversed.

An example of a method for manufacturing the semiconductor device 110 will now be described.

FIG. 2 to FIG. 5 are schematic cross-sectional views illustrating the method for manufacturing the semiconductor device according to the first embodiment.

Figure 2:
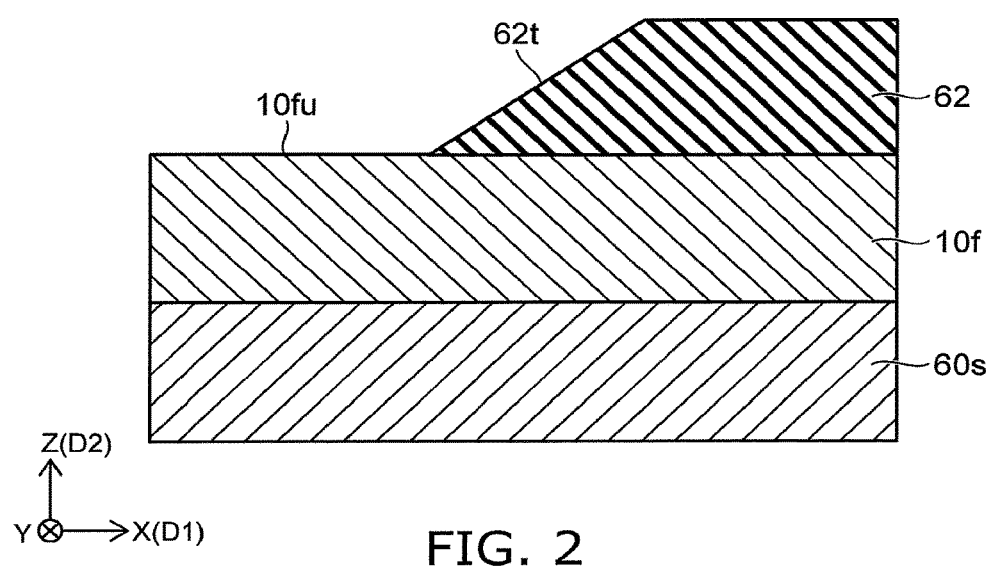
FIG. 2 is a schematic cross-sectional view illustrating the method for manufacturing the semiconductor device according to the first embodiment.

As shown in FIG. 2, a first film 10$f$ is formed on the substrate 60$s$ (e.g., the silicon substrate). The first film 10$f$ includes at least one of $Al_{x1}Ga_{1-x1}N$ (0<x1<1) or p-type $Al_{z1}Ga_{1-z1}N$ (0≤z1<1).

A mask layer 62 is formed on a portion of the first film 10$f$. The mask layer 62 includes, for example, at least one of a resist film or a hard mask film. The mask layer 62 has a tilted surface 62$t$. The tilted surface 62$t$ is tilted with respect to an upper surface 10$fu$ of the first film 10$f$. For example, the upper surface 10$fu$ is aligned with the X-Y plane.

Figure 3:
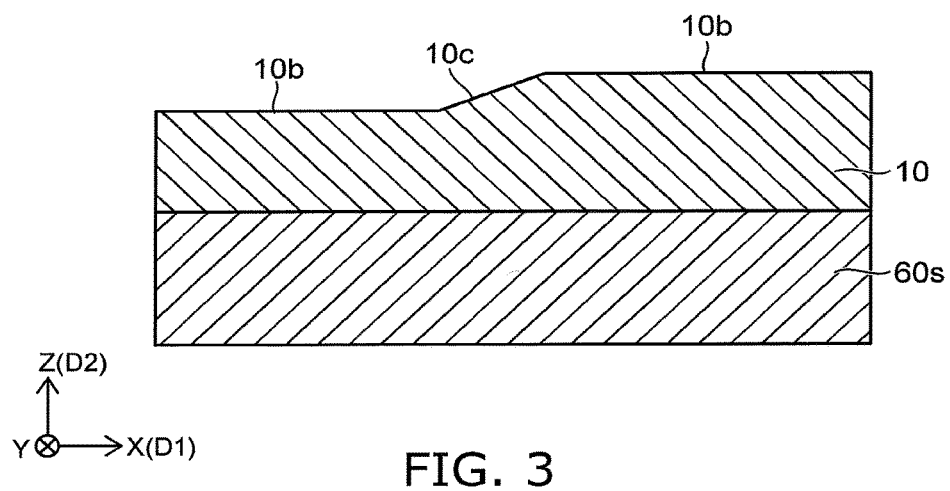
FIG. 3 is a schematic cross-sectional view illustrating the method for manufacturing the semiconductor device according to the first embodiment.

As shown in FIG. 3, a portion of the first film 10$f$ is removed using the mask layer 62 as a mask. Thereby, the first layer 10 is obtained. The first layer 10 includes at least one of $Al_{x1}Ga_{1-x1}N$ (0<x1<1) or p-type $Al_{z1}Ga_{1-z1}N$ (0≤z1<1).

The first layer 10 has the first surface 10$a$, the second surface 10$b$, and the third surface 10$c$. These surfaces are, for example, upper surfaces. The second surface 10$b$ is aligned with the first plane PL1 (e.g., the X-Y plane) including the first surface 10$a$. The third surface 10$c$ is tilted with respect to the first surface 10$a$. The position of the third surface 10$c$ in the first direction D1 along the first surface 10$a$ is between the position of the first surface 10$a$ in the first direction D1 and the position of the second surface 10$b$ in the first direction D1. The first direction D1 is, for example, the X-axis direction.

The angle between the third surface 10$c$ and the first surface 10$a$ is not less than 5 degrees and not more than 85 degrees. This angle may be, for example, not less than 20 degrees and not more than 60 degrees.

The difference in the Z-axis direction between the position in the Z-axis direction of the first surface 10$a$ and the position in the Z-axis direction of the second surface 10$b$ is, for example, not less than 0.5 μm and not more than 2 μm.

Figure 4:
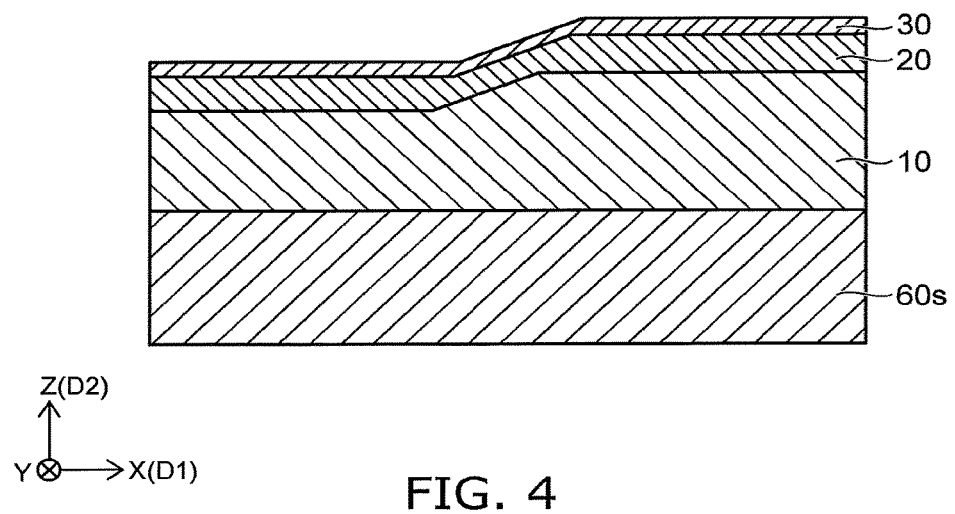
FIG. 4 is a schematic cross-sectional view illustrating the method for manufacturing the semiconductor device according to the first embodiment.

As shown in FIG. 4, the second layer 20 that includes $Al_{x2}Ga_{1-x2}N$ (0≤x2<1 and x2<x1) is formed on the first layer 10.

The third layer 30 that includes $Al_{x3}Ga_{1-x3}N$ (0<x3<1 and x2<x3) is formed on the second layer 20.

Figure 5:
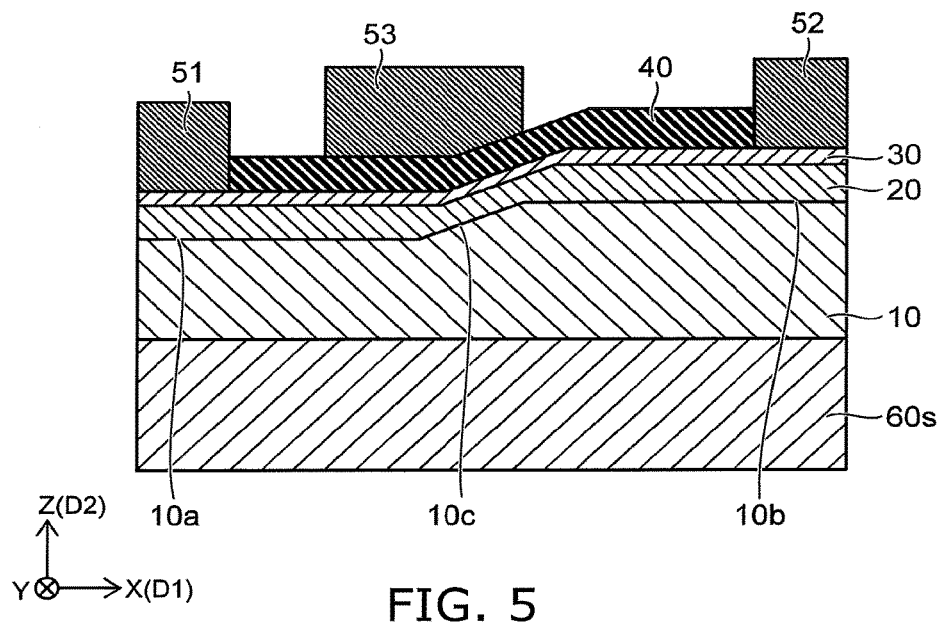
FIG. 5 is a schematic cross-sectional view illustrating the method for manufacturing the semiconductor device according to the first embodiment.

As shown in FIG. 5, the insulating layer 40 is formed on a portion of the third layer 30. The portion of the third layer 30 overlaps the third surface 10$c$ in the second direction D2 (the Z-axis direction) crossing the first surface 10$a$.

Further, the first electrode 51, the second electrode 52, and the third electrode 53 are formed. The first electrode 51 overlaps the first surface 10$a$ in the second direction D2 (the Z-axis direction). The first electrode 51 is electrically connected to another portion of the third layer 30. The second electrode 52 overlaps the second surface 10$b$ in the second direction D2. The second electrode 52 is electrically connected to yet another portion of the third layer 30. The third electrode is positioned on the insulating layer 40.

Thus, the semiconductor device 110 is formed.

The order of the formation of the first electrode 51, the second electrode 52, and the third electrode 53 is arbitrary. At least two of these electrodes may be formed simultaneously.

Interconnects may be formed further after the formation of these electrodes. The interconnects are electrically connected to at least one of the electrodes recited above. The interconnects may have a multilayered structure including inter-layer insulating films. A portion of the interconnects may have a field plate structure. For example, the local electric field concentration in a portion of the semiconductor device is relaxed. For example, a field plate structure that corresponds to the stepped portion or the gate portion of the tilted surface may be provided.

In the process described in reference to FIG. 2 recited above, the first film 10$f$ may be formed on the buffer layer 10B provided on the substrate 60$s$ (referring to FIG. 1). The buffer layer 10B includes AlN, AlGaN, etc. The buffer layer 10B is a buffer layer having a high breakdown voltage.

For example, a MOCVD apparatus is used to form the first film 10$f$ (and the buffer layer 10B), the second layer 20, and the third layer 30.

The first film 10$f$ (or the buffer layer 10B) may include, for example, at least one of a superlattice layer including AlN/AlGaN or a superlattice layer including AlN/GaN. The buffer layer 10B may include carbon. Thereby, the breakdown voltage increases. The concentration of carbon in the buffer layer 10B is, for example, $10 \times 10^{18}$ cm$^{-3}$ or more. The thickness of the first film 10$f$ (or the buffer layer 10B) is, for example, 1 μm or more.

The mask layer 62 illustrated in FIG. 2 may include, for example, $SiO_2$, SiN, etc.

In the process shown in FIG. 3, etching is performed using the mask layer 62 as a mask. In the etching, for example, RIE using a gas including at least one of $Cl_2$ or $BCl_3$ may be performed. In the etching, for example, wet etching using at least one of KOH, TMAH, or phosphoric acid may be performed. The angle of the tilted surface (the third surface 10$c$) of the first layer 10 can be controlled by the material properties of the mask layer 62, the configuration of the end portion of the mask layer 62, the etching conditions, etc.

In the embodiment, the tilt of the third surface 10$c$ may be formed by regrowth rather than etching. For example, a selective growth mask layer (which may be the mask layer 62) that has the prescribed configuration is provided on the first film 10$f$. The nitride semiconductor film does not grow in the portion covered with the selective growth mask layer. The nitride semiconductor film grows in the portion not covered with the selective growth mask layer. In such a case, the angle of the tilted surface is controllable by the regrowth conditions including at least one of the growth temperature or the gas ratio.

By the regrowth, for example, a crystal plane of the facet surface such as the (10-12) plane, the (11-22) plane, the (202-1) plane, etc., is formed. These facet surfaces are tilted with respect to the X-Y plane (e.g., the c-plane).

Thus, to form the tilted surface (the third surface 10c), at least one of formation by etching or regrowth using the facet surface is applicable.

The process is simple for the formation of the tilted surface by etching. In the formation of the tilted surface by etching, for example, there is a possibility that damage, the introduction of impurities, etc., of the crystal may occur due to the etching.

In the regrowth using the facet surface, the damage or the introduction of the impurity is suppressed. The process is complex for the regrowth using the facet surface. In the regrowth using the facet surface, the angle of the tilted surface is controlled with high precision by appropriately adjusting the conditions.

In the formation of the second layer 20 and the formation of the third layer 30 described in reference to FIG. 4, the thicknesses of the regions (the third partial region p3 and the sixth partial region p6: referring to FIG. 1) overlapping the tilted surface (the third surface 10c) easily become thinner than the other portions. For example, the source material supply rate per unit surface area is taken to be the same. In such a case, the surface area of the tilted surface is wider than the surface area of the horizontal surface. Therefore, the growth rate in the stacking direction (the growth direction) is slower for the tilted surface. On the other hand, the growth rate is faster on the c-plane which is the horizontal surface than on the tilted surface that is tilted from the c-plane. Crystal plane orientation dependence occurs in the growth rate. Thereby, the growth rate on the tilted surface easily becomes slower than the growth rate on the horizontal surface.

After the formation of the insulating layer 40, heat treatment (e.g., annealing) may be performed in nitrogen or oxygen. The concentration of the impurity inside the insulating layer 40 decreases. For example, modification or the like is performed.

Figure 6:
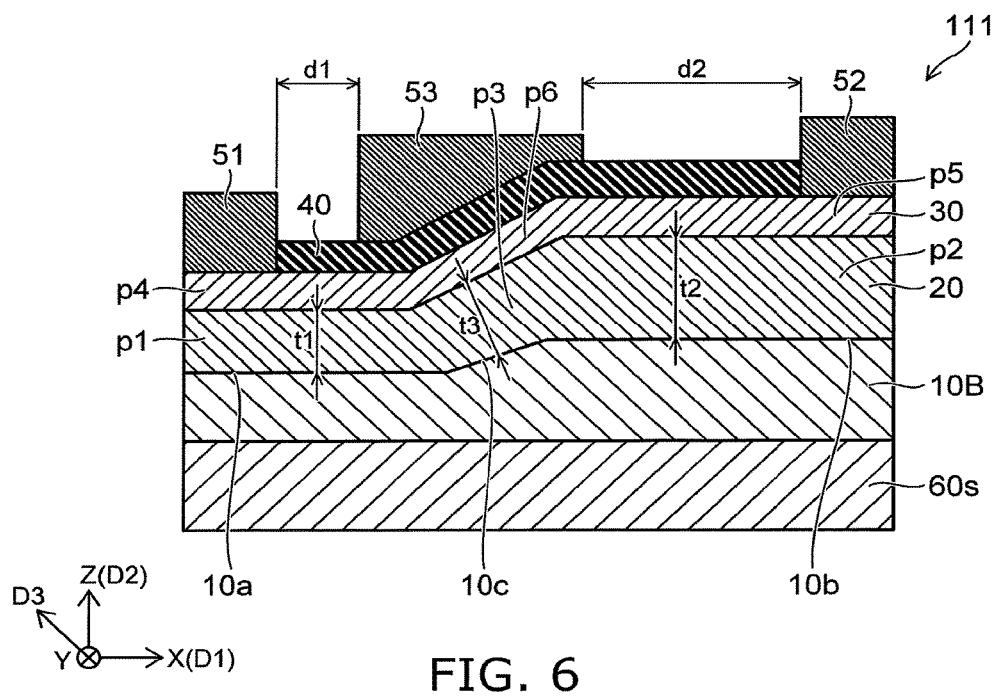
FIG. 6 is a schematic cross-sectional view illustrating another semiconductor device according to the first embodiment.

FIG. 6 is a schematic cross-sectional view illustrating another semiconductor device according to the first embodiment.

In the semiconductor device 111 according to the first embodiment as shown in FIG. 6, the second thickness t2 is thicker than the first thickness t1. Otherwise, the configuration of the semiconductor device 111 is the same as the configuration of the semiconductor device 110. In the semiconductor device 111 as well, a high threshold is obtained.

FIG. 7 to FIG. 10 are schematic cross-sectional views illustrating another method for manufacturing the semiconductor device according to the first embodiment.

Figure 7:
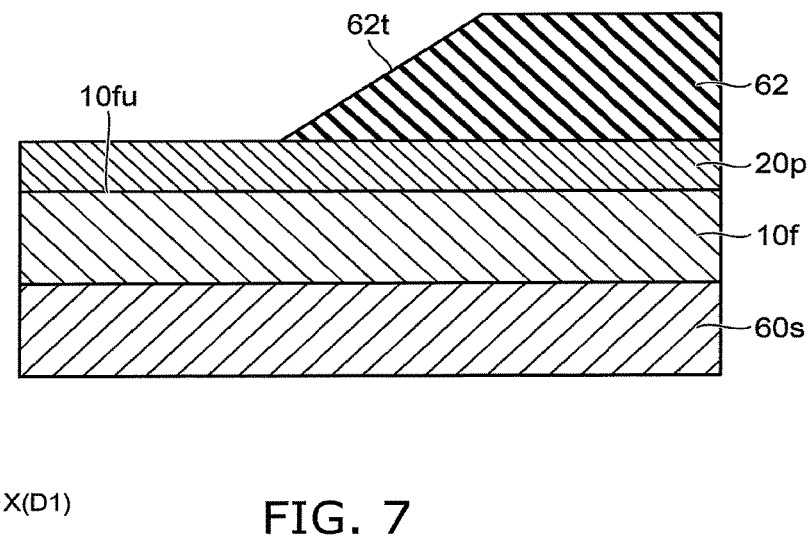
FIG. 7 is a schematic cross-sectional view illustrating another method for manufacturing the semiconductor device according to the first embodiment.

As shown in FIG. 7, a low-Al-concentration partial film 20P is formed on the first film 10f provided on the substrate 60s. The first film 10f includes at least one of $Al_{x1}Ga_{1-x1}N$ (0<x1<1) or p-type $Al_{z1}Ga_{1-z1}N$ (0≤z1<1). The low-Al-concentration partial film 20P includes, for example, $Al_\alpha Ga_{1-\alpha}N$ (0<α<1 and α<x1). For example, the first film 10f is an AlGaN film; and the low-Al-concentration partial film 20P is a GaN film.

The mask layer 62 is formed on a portion of the low-Al-concentration partial film 20P. The mask layer 62 has the tilted surface 62t. The tilted surface 62t is tilted with respect to the upper surface 10fu of the first film 10f.

Figure 8:
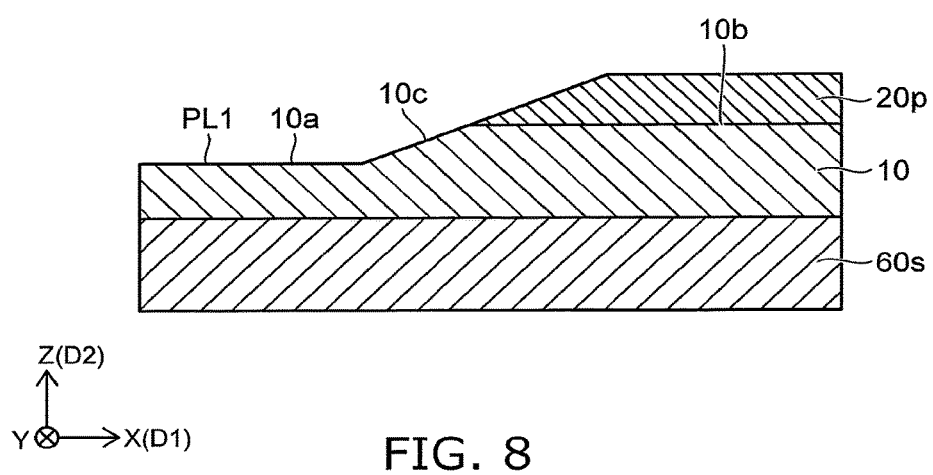
FIG. 8 is a schematic cross-sectional view illustrating another method for manufacturing the semiconductor device according to the first embodiment.

As shown in FIG. 8, a portion of the low-Al-concentration partial film 20P and a portion of the first film 10f are removed using the mask layer 62 as a mask. Thereby, the first layer 10 is obtained. The first layer 10 has the first surface 10a, the second surface 10b, and the third surface 10c. The third surface 10c is tilted with respect to the X-Y plane. In such a case, the tilted surface also is formed in the low-Al-concentration partial film 20P.

Figure 9:
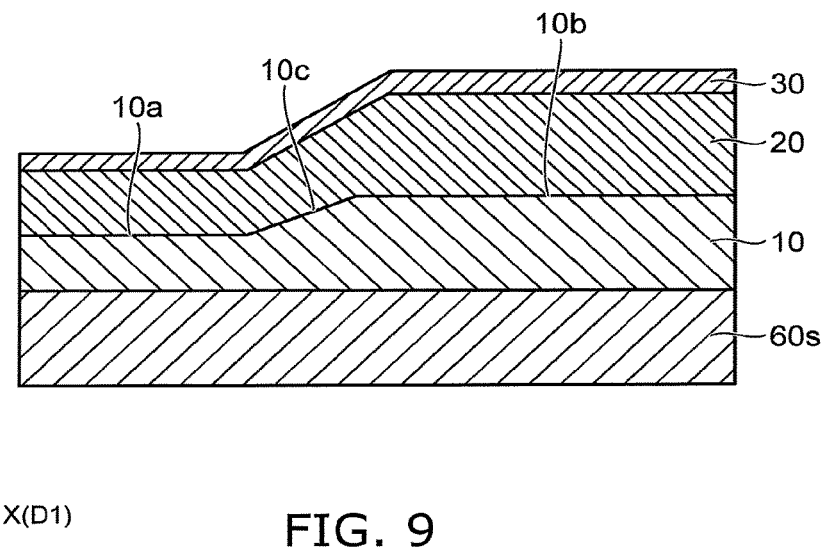
FIG. 9 is a schematic cross-sectional view illustrating another method for manufacturing the semiconductor device according to the first embodiment.

As shown in FIG. 9, a film that includes $Al_{x2}Ga_{1-x2}N$ (0≤x2<1 and x2<x1) is formed on the first layer 10 and on the low-Al-concentration partial film 20P where the tilted surface is formed. The low-Al-concentration partial film 20P and this film are used to form the second layer 20. The second layer 20 is locally thick on the second surface 10b.

The third layer 30 that includes $Al_{x3}Ga_{1-x3}N$ (0<x3<1 and x2<x3) is further formed on the second layer 20.

Figure 10:
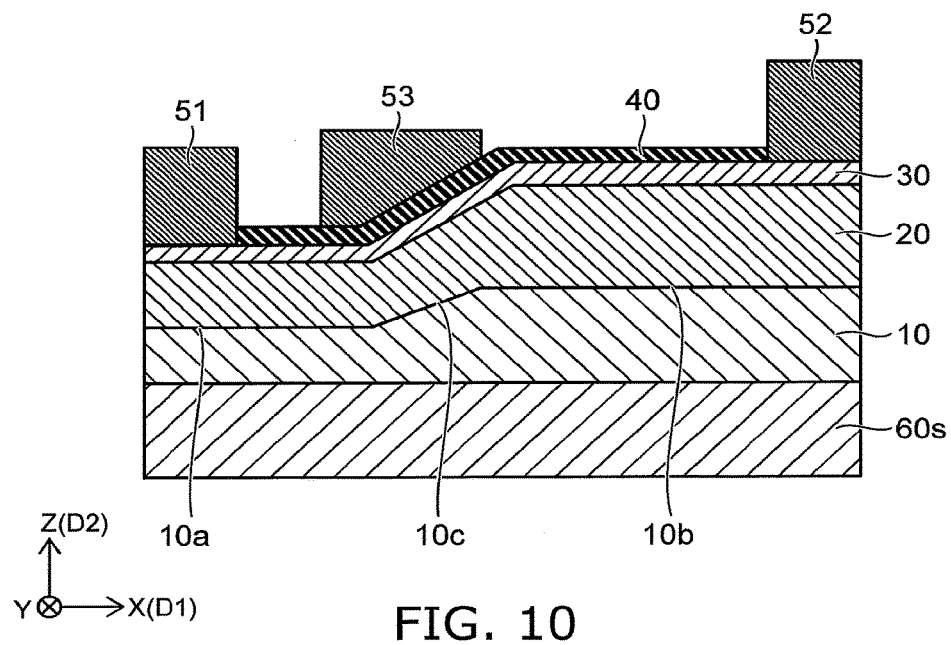
FIG. 10 is a schematic cross-sectional view illustrating another method for manufacturing the semiconductor device according to the first embodiment.

As shown in FIG. 10, the insulating layer 40, the first electrode 51, the second electrode 52, and the third electrode 53 are formed; and the semiconductor device 111 is formed.

Second Embodiment

Figure 11:
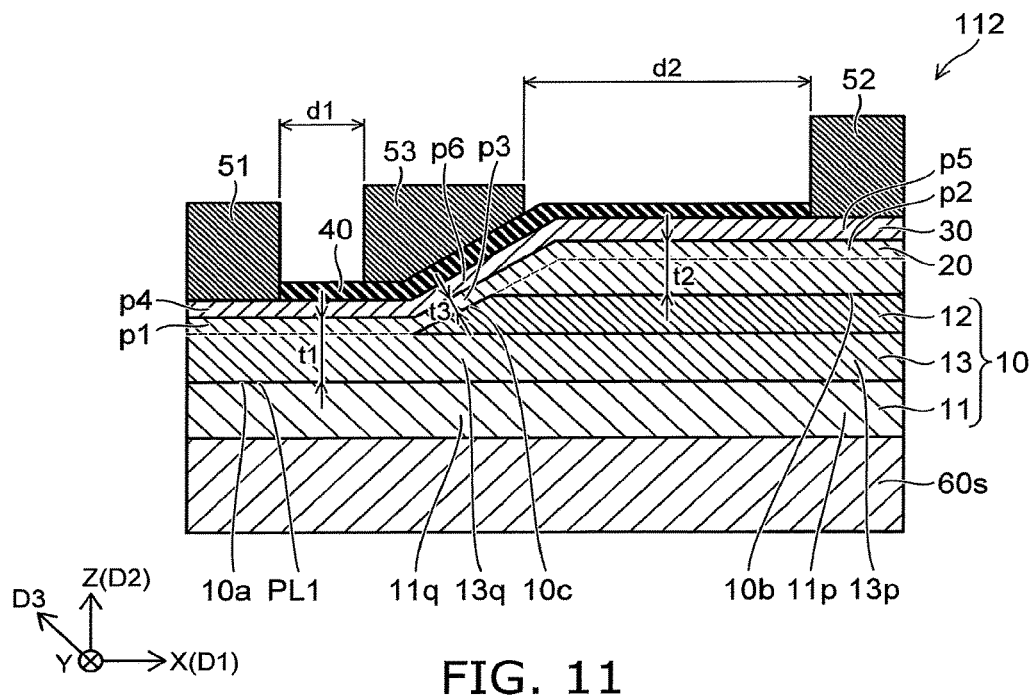
FIG. 11 is a schematic cross-sectional view illustrating a semiconductor device according to a second embodiment.

FIG. 11 is a schematic cross-sectional view illustrating a semiconductor device according to a second embodiment.

As shown in FIG. 11, the semiconductor device 112 according to the second embodiment also includes the first electrode 51, the second electrode 52, the third electrode 53, the first layer 10, the second layer 20, the third layer 30, and the insulating layer 40. In the semiconductor device 112, the first layer 10 includes a first semiconductor region 11, a second semiconductor region 12, and a third semiconductor region 13. Otherwise, the configuration of the semiconductor device 112 is similar to that of the semiconductor device 110.

In the first layer 10, the first semiconductor region 11 includes at least one of $Al_{y1}Ga_{1-y1}N$ (0<y1<1) or p-type $Al_{z1}Ga_{1-z1}N$ (0≤z1<1). The second semiconductor region 12 includes at least one of $Al_{y2}Ga_{1-y2}N$ (0<y2<1) or p-type $Al_{z2}Ga_{1-z2}N$ (0≤z2<1). The third semiconductor region 13 includes $Al_{y3}Ga_{1-y3}N$ (0≤y3<1, y3<y1, and y3<y2).

For example, the first semiconductor region 11 and the second semiconductor region 12 are AlGaN. For example, the third semiconductor region 13 is GaN. The first semiconductor region 11 and the second semiconductor region 12 function as, for example, back barrier layers.

A portion of the third semiconductor region 13 is positioned between the second semiconductor region 12 and a portion of the first semiconductor region 11.

For example, the second direction D2 crosses the first direction D1 (e.g., the X-axis direction). The second direction D2 is the Z-axis direction.

For example, at least a portion of the second semiconductor region 12 is positioned between the second electrode 52 and a portion 11p of the first semiconductor region 11 in the second direction D2 (e.g., the Z-axis direction).

A portion 13p of the third semiconductor region 13 is positioned between the portion 11p of the first semiconductor region 11 and the at least a portion of the second semiconductor region 12 recited above in the second direction D2.

Another portion 13q of the third semiconductor region 13 is positioned between the third electrode 53 and another portion 11q of the first semiconductor region 11 in the second direction D2.

The first semiconductor region 11 includes the first surface 10a. The first surface 10a is separated from the first electrode 51 in the second direction D2. The second semiconductor region 12 includes the second surface 10b. The second surface 10b is separated from the second electrode 52 in the second direction D2. The second surface 10b is aligned with the first plane PL1 (e.g., the X-Y plane) including the first surface 10a. The third semiconductor region 13 includes the third surface 10c. The third surface 10c is separated from the third electrode 53 in the second direction D2. The third surface 10c is tilted with respect to the first plane PL1.

The second layer 20 includes the first partial region p1, the second partial region p2, and the third partial region p3 described above. The second layer 20 includes $Al_{x2}Ga_{1-x2}N$ (0≤x2<1, x2<y1, and x2<y2).

The third layer 30 includes the fourth partial region p4, the fifth partial region p5, and the sixth partial region p6 described above. The third layer 30 includes $Al_{x3}Ga_{1-x3}N$ (0<x3<1, x2<x3, and y3<x3).

In the example as well, the insulating layer 40 is provided between the third electrode 53 and the sixth partial region p6 in the second direction D2.

In the semiconductor device 112 as well, the polarization weakens in the region between the third surface 10c and the third electrode 53. Thereby, a high threshold is obtained.

A strong polarization acts at the vicinity of the first electrode 51 and the vicinity of the second electrode 52. Thereby, the resistance is low. A high threshold and a low on-resistance are obtained. The good characteristics of a normally-off characteristic (a high threshold) and a low on-resistance are obtained.

In the semiconductor device 112 as well, for example, the third thickness t3 is thinner than the first thickness t1. The third thickness t3 is thinner than the second thickness t2. The threshold increases further.

Various configurations described in reference to the semiconductor device 110 or the semiconductor device 111 are applicable to the semiconductor device 112.

An example of the method for manufacturing the semiconductor device 112 will now be described.

FIG. 12 to FIG. 15 are schematic cross-sectional views illustrating another method for manufacturing the semiconductor device according to the second embodiment.

Figure 12:
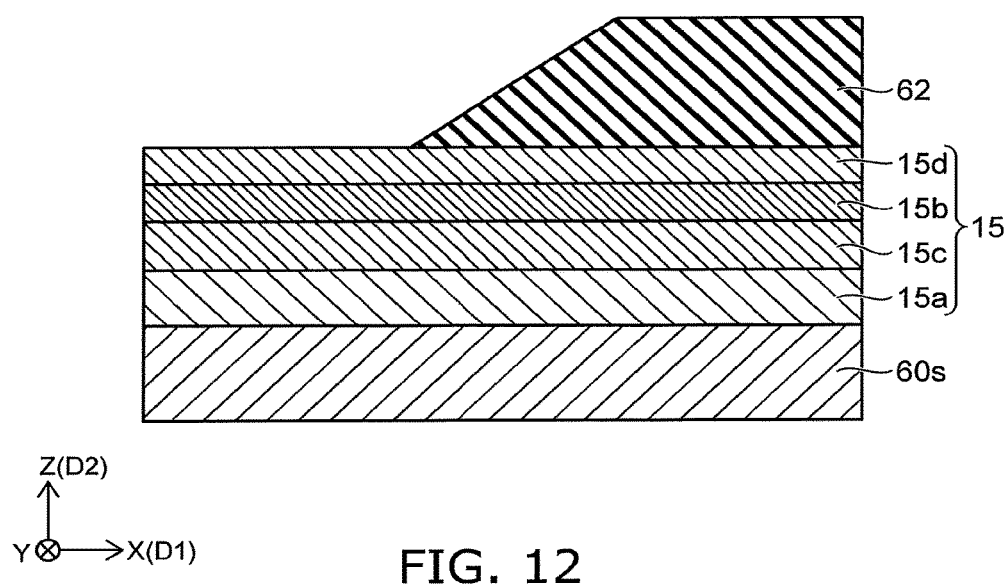
FIG. 12 is a schematic cross-sectional view illustrating another method for manufacturing the semiconductor device according to the second embodiment.

As shown in FIG. 12, a stacked film 15 is formed on the substrate 60s (e.g., the silicon substrate). The stacked film 15 includes a first semiconductor film 15a, a second semiconductor film 15b, a third semiconductor film 15c, and a fourth semiconductor film 15d.

The first semiconductor film 15a includes at least one of $Al_{y1}Ga_{1-y1}N$ (0<y1<1) or p-type $Al_{z1}Ga_{1-z1}N$ (0≤z1<1). The second semiconductor film 15b includes at least one of $Al_{y2}Ga_{1-y2}N$ (0<y2<1) or p-type $Al_{z2}Ga_{1-z2}N$ (0≤z2<1). The third semiconductor film 15c includes $Al_{y3}Ga_{1-y3}N$ (0≤y3<1, y3<y1, and y3<y2). The fourth semiconductor film 15d includes $Al_{y4}Ga_{1-y4}N$ (0≤y4<1, y4<y1, and y4<y2).

The first semiconductor film 15a and the second semiconductor film 15b are, for example, AlGaN. Or, the first semiconductor film 15a and the second semiconductor film 15b may be, for example, p-type GaN. The third semiconductor film 15c and the fourth semiconductor film 15d are, for example, GaN.

For example, the first semiconductor film 15a is on the substrate 60s. The third semiconductor film 15c is on the first semiconductor film 15a. The second semiconductor film 15b is on the third semiconductor film 15c. The fourth semiconductor film 15d is on the second semiconductor film 15b. The mask layer 62 is provided on a portion of such a stacked film 15. The mask layer 62 has the tilted surface 62t. The tilted surface 62t is tilted with respect to the X-Y plane.

A portion of the fourth semiconductor film 15d and a portion of the second semiconductor film 15b are removed by performing etching using the mask layer 62.

Figure 13:
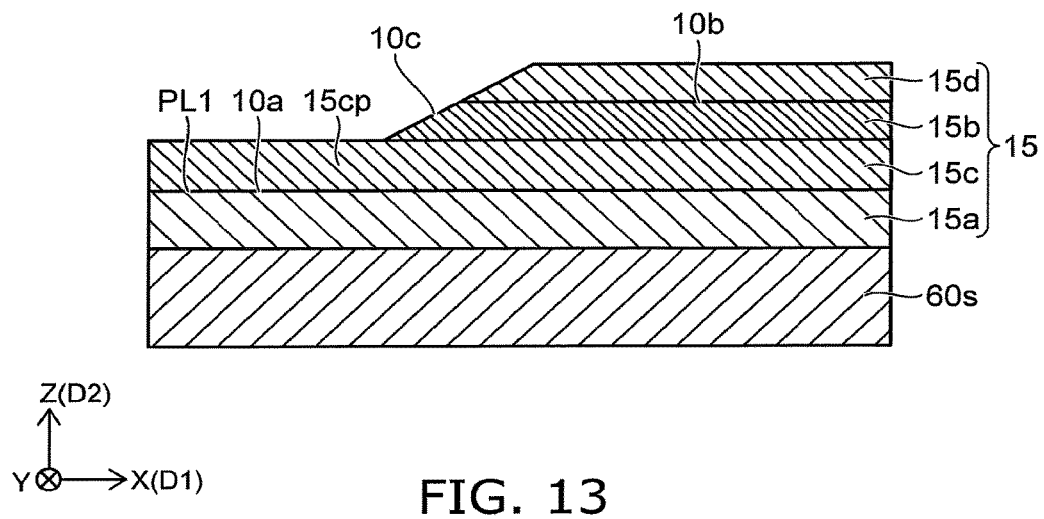
FIG. 13 is a schematic cross-sectional view illustrating another method for manufacturing the semiconductor device according to the second embodiment.
Figure 14:
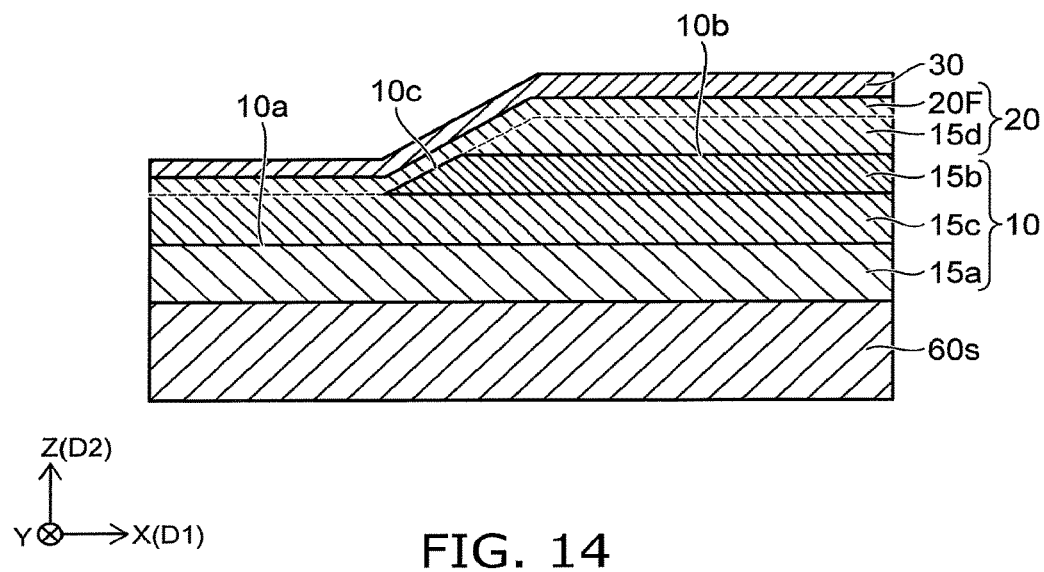
FIG. 14 is a schematic cross-sectional view illustrating another method for manufacturing the semiconductor device according to the second embodiment.

Thereby, a portion 15cp of the third semiconductor film 15c is exposed as shown in FIG. 13. Thereby, the following structure is formed. The first semiconductor film 15a includes the first surface 10a. The remaining portion of the second semiconductor film 15b includes the second surface 10b and the third surface 10c. The position of the third surface 10c in the first direction D1 along the first surface 10a is between the position of the first surface 10a in the first direction D1 and the position of the second surface 10b in the first direction D1. The first surface 10a overlaps the portion 15cp of the third semiconductor film 15c recited above in the second direction D2 crossing the first direction D1. The second surface 10b is aligned with the first plane PL1 including the first surface 10a. The third surface 10c is tilted with respect to the first plane PL1. The third surface 10c is tilted with respect to the first surface 10a and tilted with respect to the second surface 10b.

A second partial layer 20F is formed on the first surface 10a, the third surface 10c, and the remaining portion of the fourth semiconductor film 15d. The second partial layer 20F includes $Al_{x2}Ga_{1-x2}N$ (0≤x2<1, x2<y1, and x2<y2). The second partial layer 20F is, for example, a GaN layer. The second partial layer 20F and the remaining portion of the fourth semiconductor film 15d are used to form the second layer 20.

The third layer 30 is further formed on the second partial layer 20F. The third layer 30 includes $Al_{x3}Ga_{1-x3}N$ (0<x3<1 and x2<x3).

Figure 15:
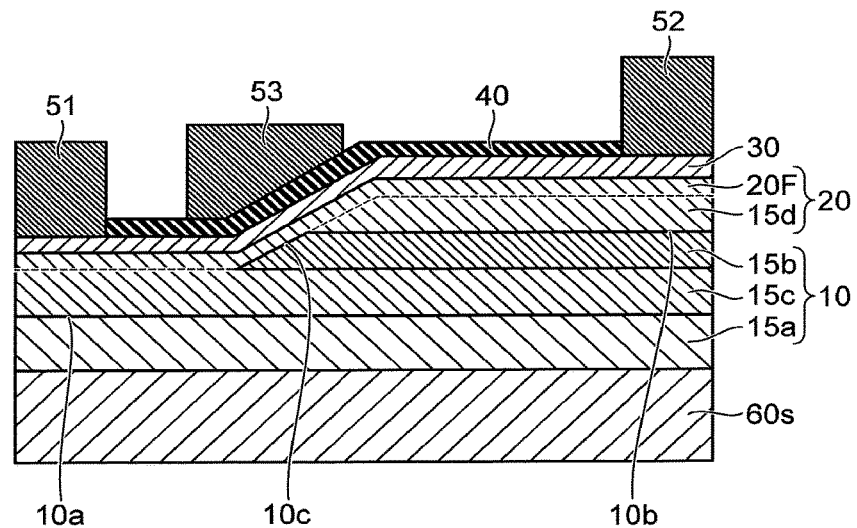
FIG. 15 is a schematic cross-sectional view illustrating another method for manufacturing the semiconductor device according to the second embodiment.

As shown in FIG. 15, the insulating layer 40 is formed on a portion of the third layer 30. The portion of the third layer 30 overlaps the third surface 10c in the second direction D2 (the Z-axis direction). The first electrode 51, the second electrode 52, and the third electrode 53 are formed.

Thereby, the semiconductor device 112 is formed.

At least a portion of the first semiconductor film 15a is used to form the first semiconductor region 11 (referring to FIG. 11). At least a portion of the remaining portion of the second semiconductor film 15b is used to form the second semiconductor region 12 (referring to FIG. 11). At least a portion of the third semiconductor film 15c is used to form the third semiconductor region 13 (referring to FIG. 11). The remaining portion of the fourth semiconductor film 15d is used to form a portion of the second layer 20.

Third Embodiment

Figure 16:
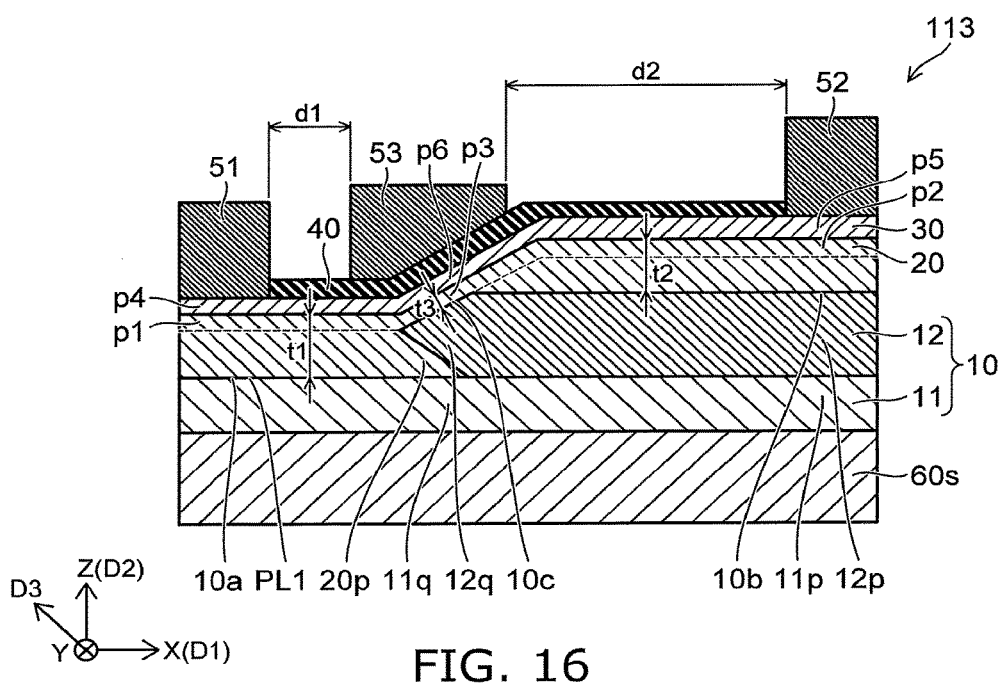
FIG. 16 is a schematic cross-sectional view illustrating a semiconductor device according to a third embodiment.

FIG. 16 is a schematic cross-sectional view illustrating a semiconductor device according to a third embodiment.

As shown in FIG. 16, the semiconductor device 113 according to the third embodiment also includes the first electrode 51, the second electrode 52, the third electrode 53, the first layer 10, the second layer 20, the third layer 30, and the insulating layer 40. In the semiconductor device 113, the first layer 10 includes the first semiconductor region 11 and the second semiconductor region 12. Otherwise, the configuration of the semiconductor device 113 is similar to that of the semiconductor device 110.

In the first layer 10, the first semiconductor region 11 includes at least one of $Al_{y1}Ga_{1-y1}N$ (0<y1<1) or p-type $Al_{z1}Ga_{1-z1}N$ (0≤z1<1). The second semiconductor region 12 includes at least one of $Al_{y2}Ga_{1-y2}N$ (0<y2<1) or p-type $Al_{z2}Ga_{1-z2}N$ (0≤z2<1). The first semiconductor region 11 and the second semiconductor region 12 include, for example, AlGaN. Or, the first semiconductor region 11 and the second semiconductor region 12 may include p-type GaN.

A portion of the second semiconductor region 12 is positioned between the second electrode 52 and the portion 11p of the first semiconductor region 11 in the second direction D2. The second direction D2 crosses the first direction D1 (the X-axis direction). The second direction D2 is, for example, the Z-axis direction.

Another portion 12q of the second semiconductor region 12 is positioned between the third electrode 53 and the other portion 11q of the first semiconductor region 11 in the second direction D2.

The first semiconductor region 11 includes the first surface 10a. The first surface 10a is separated from the first electrode 51 in the second direction D2.

A portion 12p of the second semiconductor region 12 recited above includes the second surface 10b. The second surface 10b is separated from the second electrode 52 in the second direction D2. The second surface 10b is aligned with the first plane PL1 (e.g., the X-Y plane) including the first surface 10a.

The other portion 12q of the second semiconductor region 12 recited above includes the third surface 10c. The third surface 10c is separated from the third electrode 53 in the second direction D2. The third surface 10c is tilted with respect to the first plane PL1. The third surface 10c is tilted with respect to the first surface 10a and the second surface 10b.

The second layer 20 includes $Al_{x2}Ga_{1-x2}N$ ($0 \le x2 < 1$, $x2 < y1$, and $x2 < y2$). The second layer 20 is, for example, a GaN layer. The second layer 20 includes the first partial region p1, the second partial region p2, and the third partial region p3 described above.

The third layer 30 includes $Al_{x3}Ga_{1-x3}N$ ($0 < x3 < 1$ and $x2 < x3$). The third layer 30 is, for example, an AlGaN layer. The third layer 30 includes the fourth partial region p4, the fifth partial region p5, and the sixth partial region p6 described above.

In the example as well, the insulating layer 40 is provided between the third electrode 53 and the sixth partial region p6 in the second direction D2.

In the semiconductor device 113 as well, the polarization weakens in the region between the third surface 10c and the third electrode 53. Thereby, a high threshold is obtained.

A strong polarization acts at the vicinity of the first electrode 51 and the vicinity of the second electrode 52. Thereby, the resistance is low. A high threshold and a low on-resistance are obtained. The good characteristics of a normally-off characteristic (a high threshold) and a low on-resistance are obtained.

In the semiconductor device 113 as well, for example, the third thickness t3 is thinner than the first thickness t1. The third thickness t3 is thinner than the second thickness t2. The threshold increases further.

In the example as shown in FIG. 16, a portion 20p of the second layer 20 overlaps the third electrode 53 in the second direction D2. The third surface 10c is positioned between the third electrode 53 and the portion 20p of the second layer 20 in the second direction D2. In such a configuration as well, a high threshold is obtained.

The front surface of the portion 20p of the second layer 20 is tilted with respect to the X-Y plane. The tilt direction is the reverse of the tilt direction of the third surface 10c.

Various configurations described in reference to the semiconductor device 110, the semiconductor device 111, or the semiconductor device 112 are applicable to the semiconductor device 113.

An example of the method for manufacturing the semiconductor device 113 will now be described.

FIG. 17 to FIG. 20 are schematic cross-sectional views illustrating another method for manufacturing the semiconductor device according to the third embodiment.

Figure 17:
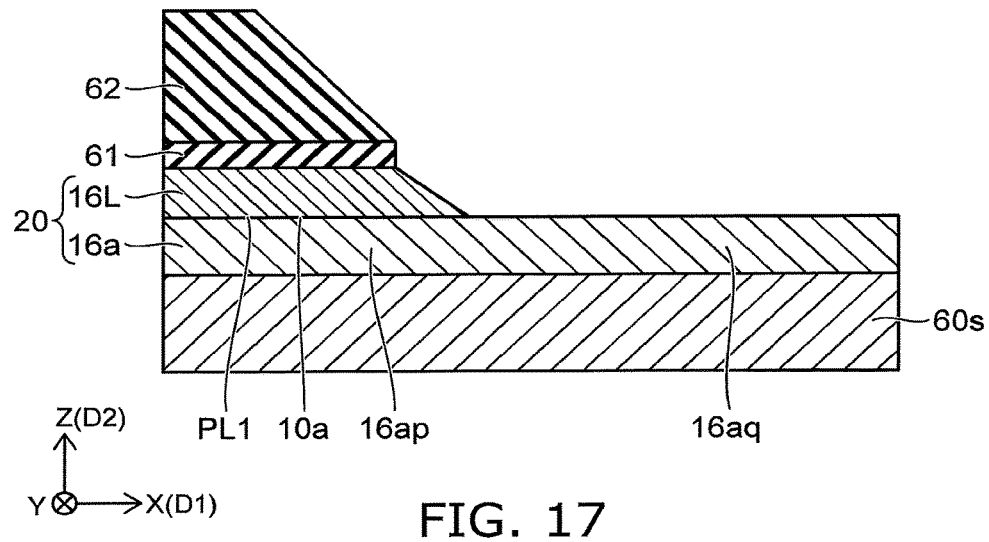
FIG. 17 is a schematic cross-sectional view illustrating another method for manufacturing the semiconductor device according to the third embodiment.

As shown in FIG. 17, a stacked film 16 is formed on the substrate 60s (e.g., the silicon substrate). The stacked film 16 includes a first semiconductor film 16a and a first low-Al-concentration film 16L. The first semiconductor film 16a is formed on the substrate 60s; and the first low-Al-concentration film 16L is formed on the first semiconductor film 16a. A hard mask 61 is formed on a portion of the first low-Al-concentration film 16L; and the mask layer 62 (e.g., a resist mask) is formed on the hard mask 61. The hard mask 61 is patterned using the mask layer 62; further, a portion of the first low-Al-concentration film 16L is removed. Thereby, the stacked film 16 is formed.

In the stacked film 16, the first semiconductor film 16a includes at least one of $Al_{y1}Ga_{1-y1}N$ ($0 < y1 < 1$) or p-type $Al_{z1}Ga_{1-z1}N$ ($0 \le z1 < 1$). The first semiconductor film 16a is, for example, an AlGaN layer or a p-type GaN layer.

The first semiconductor film 16a includes a first portion 16ap and a second portion 16aq. The direction from the first portion 16ap toward the second portion 16aq is aligned with the first direction D1 (e.g., the X-axis direction).

In the stacked film 16, the first low-Al-concentration film 16L includes $Al_{y5}Ga_{1-y5}N$ ($0 \le y5 < 1$ and $y5 < y1$). The first low-Al-concentration film 16L is, for example, a GaN layer. The first low-Al-concentration film 16L is provided on the first surface 10a of the first portion 16ap. The first surface 10a is aligned with the X-Y plane.

Figure 18:
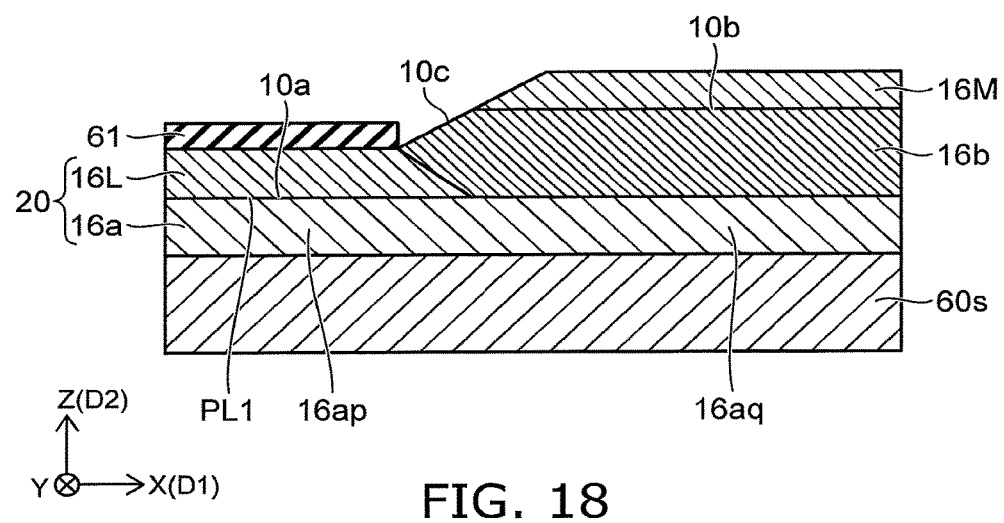
FIG. 18 is a schematic cross-sectional view illustrating another method for manufacturing the semiconductor device according to the third embodiment.

As shown in FIG. 18, a second semiconductor film 16b is formed on the second portion 16aq of the stacked film 16. The second semiconductor film 16b includes at least one of $Al_{y2}Ga_{1-y2}N$ ($0 < y2 < 1$ and $y5 < y2$) or p-type $Al_{z2}Ga_{1-z2}N$ ($0 \le z2 < 1$). The second semiconductor film 16b is, for example, an AlGaN layer or a p-type GaN layer.

The second semiconductor film 16b includes the second surface 10b and the third surface 10c. The second surface 10b is aligned with the first plane PL1 (e.g., the X-Y plane) including the first surface 10a. The third surface 10c is tilted with respect to the first plane PL1. The third surface 10c is tilted with respect to the first surface 10a and tilted with respect to the second surface 10b.

The position of the third surface 10c in the first direction D1 (e.g., the X-axis direction) along the first surface 10a is between the position of the first surface 10a in the first direction D1 and the position of the second surface 10b in the first direction D1.

Further, a second low-Al-concentration film 16M is formed on the second surface 10b. The second low-Al-concentration film 16M includes $Al_{y3}Ga_{1-y3}N$ ($0 \le y3 < 1$, $y3 < y1$, and $y3 < y2$). The second low-Al-concentration film 16M is, for example, a GaN layer.

Figure 19:
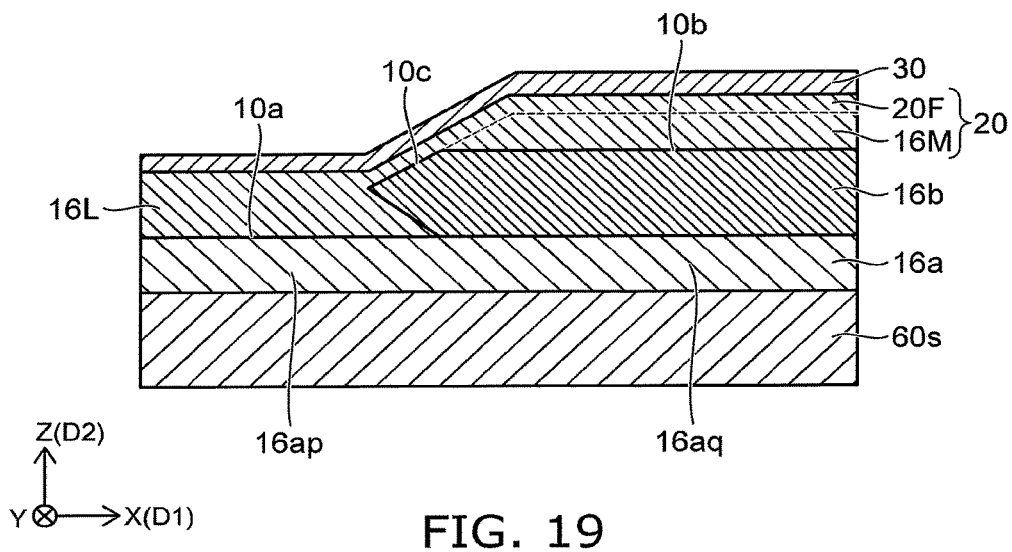
FIG. 19 is a schematic cross-sectional view illustrating another method for manufacturing the semiconductor device according to the third embodiment.

As shown in FIG. 19, the second partial layer 20F is formed on the first low-Al-concentration film 16L, the third surface 10c, and the second low-Al-concentration film 16M. The second partial layer 20F includes $Al_{x2}Ga_{1-x2}N$ ($0 \le x2 < 1$, $x2 < y1$, and $x2 < y2$). The second partial layer 20F is, for example, a GaN layer. The second partial layer 20F, at least a portion of the first low-Al-concentration film 16L, and at least a portion of the second low-Al-concentration film 16M are used to form the second layer 20.

Further, the third layer 30 that includes $Al_{x3}Ga_{1-x3}N$ ($0 < x3 < 1$ and $x2 < x3$) is formed on the second partial layer 20F.

Figure 20:
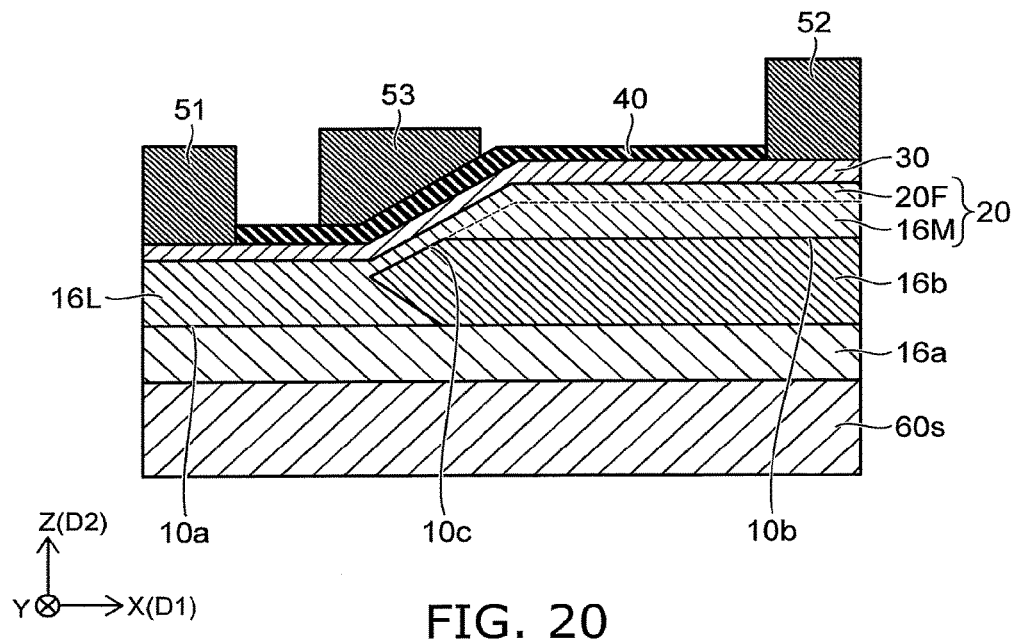
FIG. 20 is a schematic cross-sectional view illustrating another method for manufacturing the semiconductor device according to the third embodiment.
Figure 21:
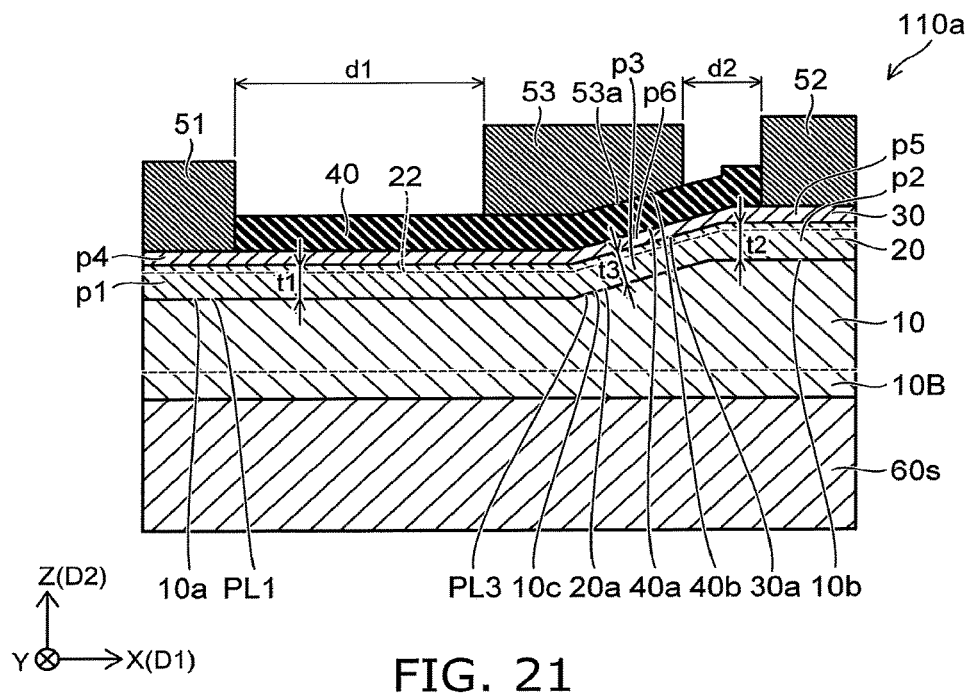
FIG. 21 is a schematic cross-sectional view illustrating another semiconductor device according to the embodiment.
Figure 22:
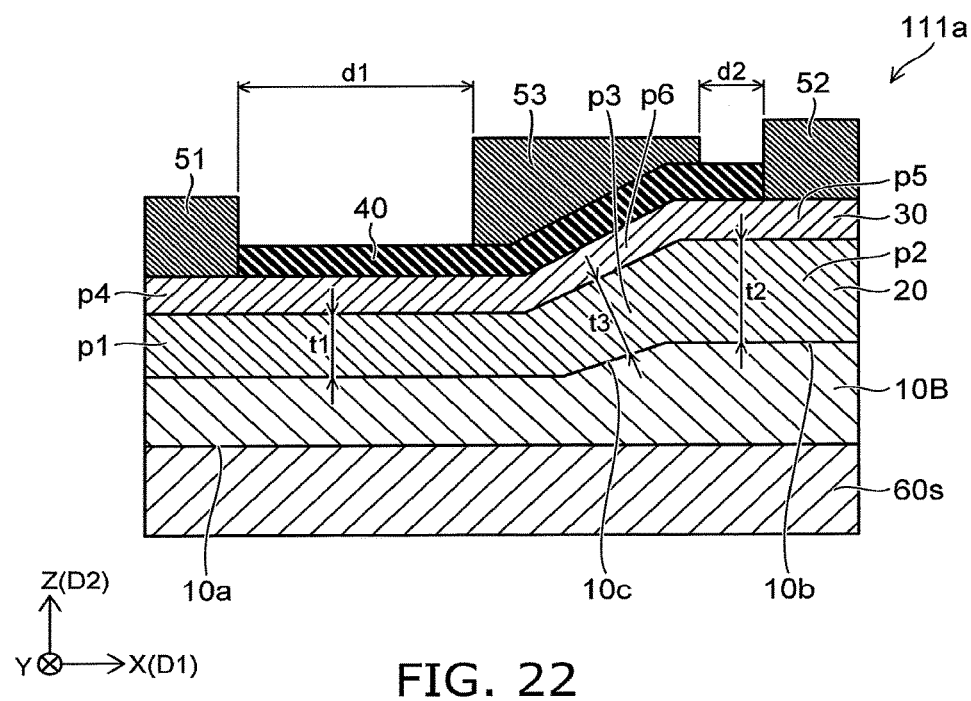
FIG. 22 is a schematic cross-sectional view illustrating another semiconductor device according to the embodiment.
Figure 23:
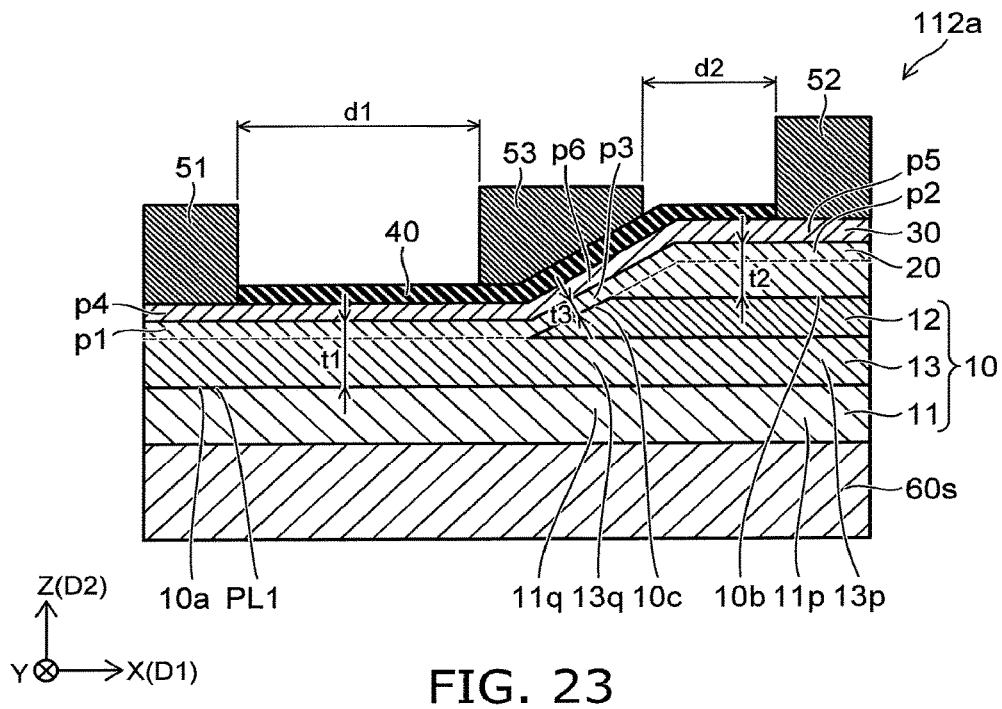
FIG. 23 is a schematic cross-sectional view illustrating another semiconductor device according to the embodiment.
Figure 24:
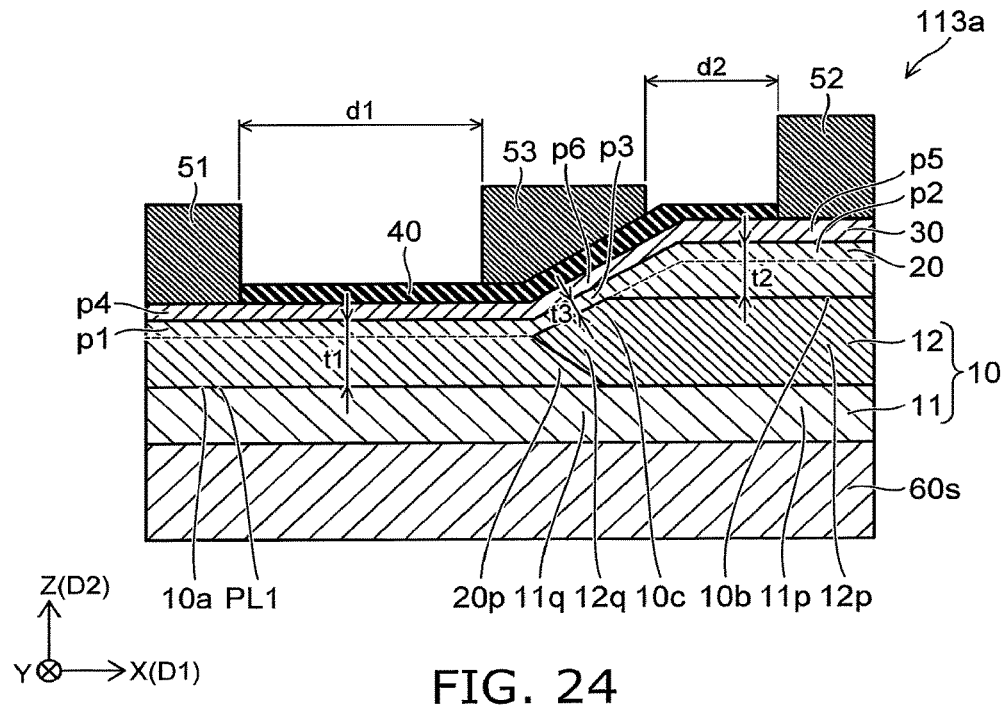
FIG. 24 is a schematic cross-sectional view illustrating another semiconductor device according to the embodiment.

As shown in FIG. 20, the insulating layer 40 is formed on a portion of the third layer 30. The portion of the third layer 30 overlaps the third surface 10c in the second direction D2

(the Z-axis direction). The first electrode 51, the second electrode 52, and the third electrode 53 are formed.

Thereby, the semiconductor device 113 is formed.

At least a portion of the first semiconductor film 16a is used to form the first semiconductor region 11 (referring to FIG. 11). At least a portion of the second semiconductor film 16b is used to form the second semiconductor region 12 (referring to FIG. 12).

FIG. 21 to FIG. 24 are schematic cross-sectional views illustrating another semiconductor device according to the embodiment.

In the semiconductor devices 110a to 113a as shown in FIG. 21 to FIG. 24, the first distance d1 along the first direction D1 between the first electrode 51 and the third electrode 53 is longer than the second distance d2 along the first direction D1 between the second electrode 52 and the third electrode 53. Otherwise, the configurations of the semiconductor devices 110a to 113a are similar to those of the semiconductor devices 110 to 113. In the semiconductor devices 110a to 113a as well, a high threshold can be obtained.

In the semiconductor devices 110 to 113, the first electrode 51 overlaps at least a portion of the third layer 30 in the first direction D1 (the X-axis direction). In the embodiment, the first electrode 51 and the second electrode 52 may be interchanged. In such a case, the second electrode 52 overlaps at least a portion of the third layer 30 in the first direction D1.

In the semiconductor devices 110 to 113 and 110a to 113a, the position of the lower surface of the first electrode 51 is different from the position of the lower surface of the second electrode 52 when referenced to the substrate 60s. For example, the distance along the second direction D2 (the Z-axis direction) between the substrate 60s and the first surface 10a is different from the distance along the second direction D2 (the Z-axis direction) between the substrate 60s and the second surface 10b. For example, the position of the third surface 10c in the second direction D2 is between the position of the first surface 10a in the second direction D2 and the position of the second surface 10b in the second direction D2.

For example, high precision is obtained relatively easily in the formation of such a structure. Stable characteristics are obtained easily.

Fourth Embodiment

Figure 25:
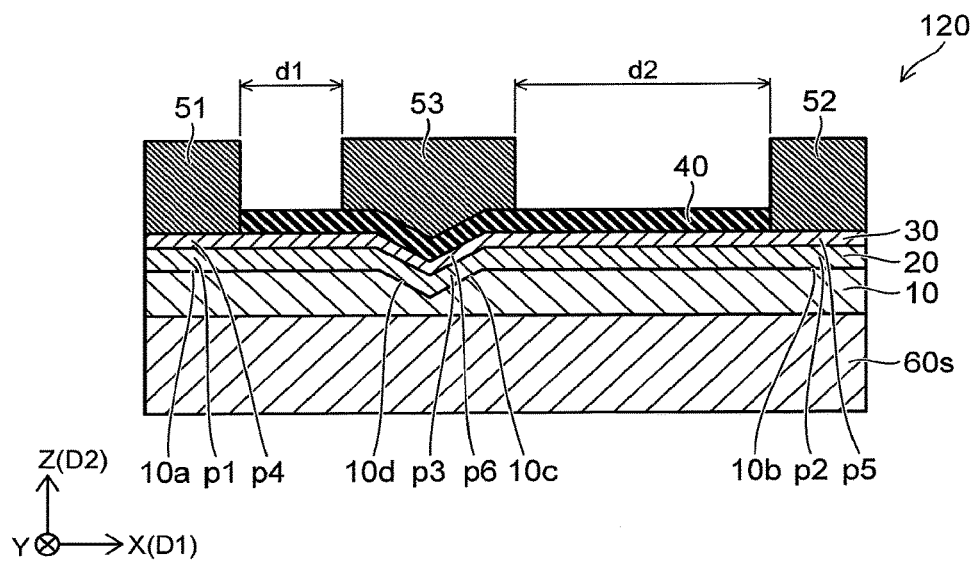
FIG. 25 is a schematic cross-sectional view illustrating a semiconductor device according to a fourth embodiment.

FIG. 25 is a schematic cross-sectional view illustrating a semiconductor device according to a fourth embodiment.

As shown in FIG. 25, the semiconductor device 120 according to the fourth embodiment also includes the first electrode 51, the second electrode 52, the third electrode 53, the first layer 10, the second layer 20, the third layer 30, and the insulating layer 40. In the semiconductor device 120, the first layer 10 has a fourth surface 10d in addition to the first surface 10a, the second surface 10b, and the third surface 10c. Otherwise, the configuration of the semiconductor device 120 is similar to that of the semiconductor device 110.

In the example as well, the first layer 10 includes at least one of $Al_{x1}Ga_{1-x1}N$ ($0<x1<1$) or p-type $Al_{z1}Ga_{1-z1}N$ ($0 \le z1<1$). The second layer 20 includes $Al_{x2}Ga_{1-x2}N$ ($0 \le x2<1$ and $x2<x1$). The third layer 30 includes $Al_{x3}Ga_{1-x3}N$ ($0<x3<1$ and $x2<x3$).

The fourth surface 10d is tilted with respect to the first surface 10a (or the first plane PL1). The fourth surface 10d crosses the third surface 10c. For example, the position of the fourth surface 10d in the first direction D1 (the X-axis direction) is between the position of the first surface 10a in the first direction D1 and the position of the third surface 10c in the first direction D1. The fourth surface 10d is continuous with the first surface 10a and continuous with the third surface 10c. The third surface 10c and the fourth surface 10d are a concave surface of the first layer 10.

The third partial region p3 of the second layer 20 is between the third electrode 53 and the third surface 10c and between the third electrode 53 and the fourth surface 10d. Even in such a case, the sixth partial region p6 of the third layer 30 is between the third electrode 53 and the third partial region p3.

The third partial region p3 is between, in the first direction D1 (the X-axis direction), two portions included in the first layer 10.

In the semiconductor device 120 as well, the polarization weakens in the region between the third surface 10c and the third electrode 53 and between the fourth surface 10d and the third electrode 53. Thereby, a high threshold is obtained.

For example, the second layer 20 and the third layer 30 bend greatly at the boundary portion between the third surface 10c and the fourth surface 10d. The threshold easily increases further.

A strong polarization acts at the vicinity of the first electrode 51 and the vicinity of the second electrode 52. Thereby, the resistance is low. A high threshold and a low on-resistance are obtained. The good characteristics of a normally-off characteristic (a high threshold) and a low on-resistance are obtained.

FIG. 26 to FIG. 29 are schematic cross-sectional views illustrating a method for manufacturing the semiconductor device according to the fourth embodiment.

Figure 26:
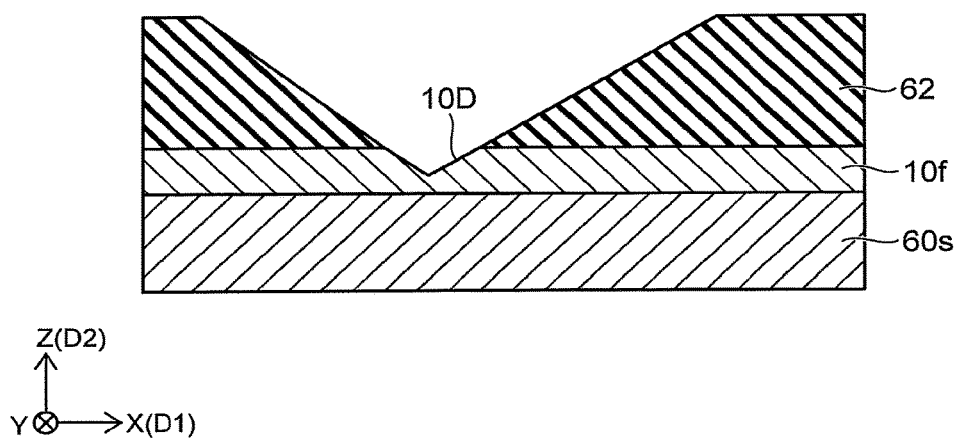
FIG. 26 is a schematic cross-sectional view illustrating a method for manufacturing the semiconductor device according to the fourth embodiment.

As shown in FIG. 26, the first film 10f that is used to form the first layer 10 is formed on the substrate 60s (e.g., the silicon substrate); and the mask layer 62 is formed on the first film 10f. At the opening of the mask layer 62, the first film 10f is removed; and a recess 10D is formed. The recess 10D has a tilted surface. Thereby, the first layer 10 is obtained.

Figure 27:
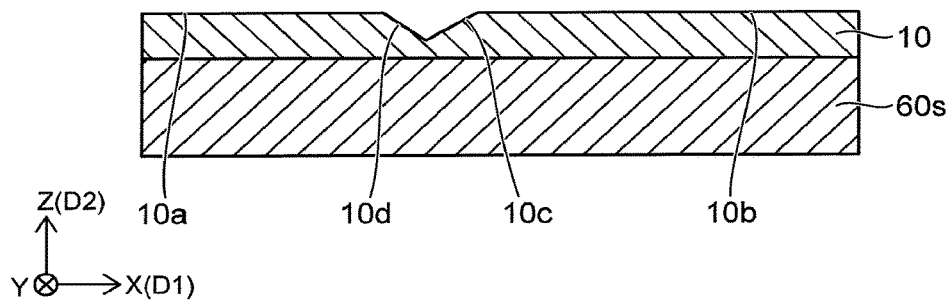
FIG. 27 is a schematic cross-sectional view illustrating a method for manufacturing the semiconductor device according to the fourth embodiment.

As shown in FIG. 27, the first layer 10 has the first surface 10a, the second surface 10b, the third surface 10c, and the fourth surface 10d.

Figure 28:
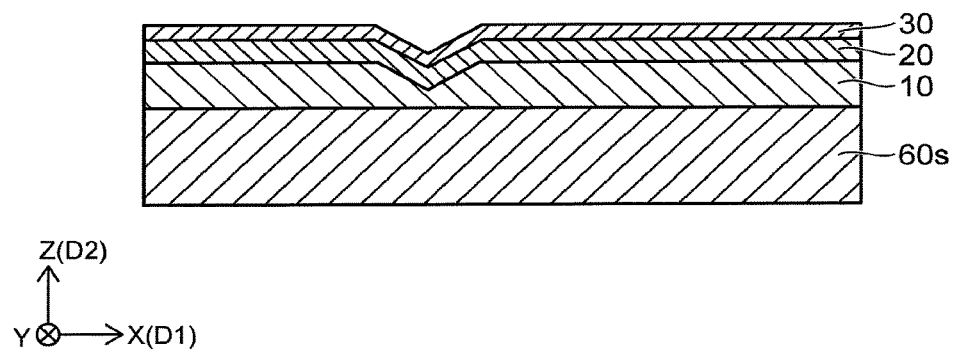
FIG. 28 is a schematic cross-sectional view illustrating a method for manufacturing the semiconductor device according to the fourth embodiment.

The second layer 20 and the third layer 30 are formed as shown in FIG. 28.

Figure 29:
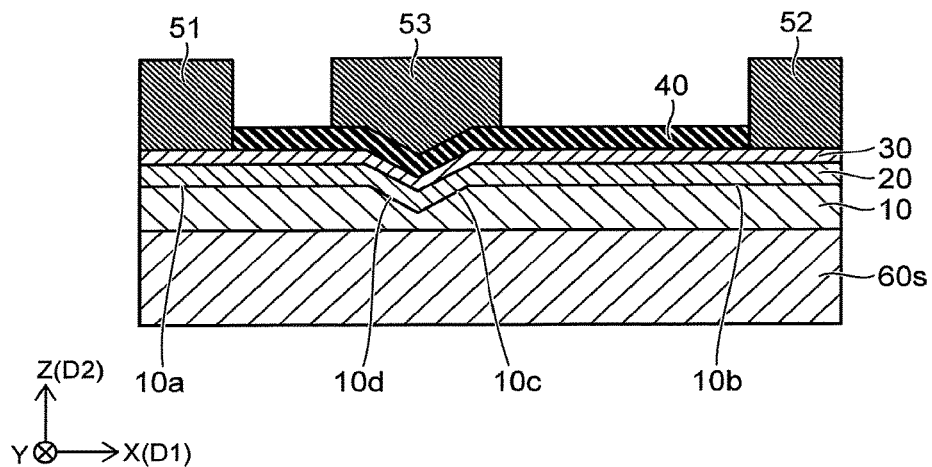
FIG. 29 is a schematic cross-sectional view illustrating a method for manufacturing the semiconductor device according to the fourth embodiment.

As shown in FIG. 29, the insulating layer 40, the first electrode 51, the second electrode 52, and the third electrode 53 are formed. Thereby, the semiconductor device 120 is obtained.

Figure 30:
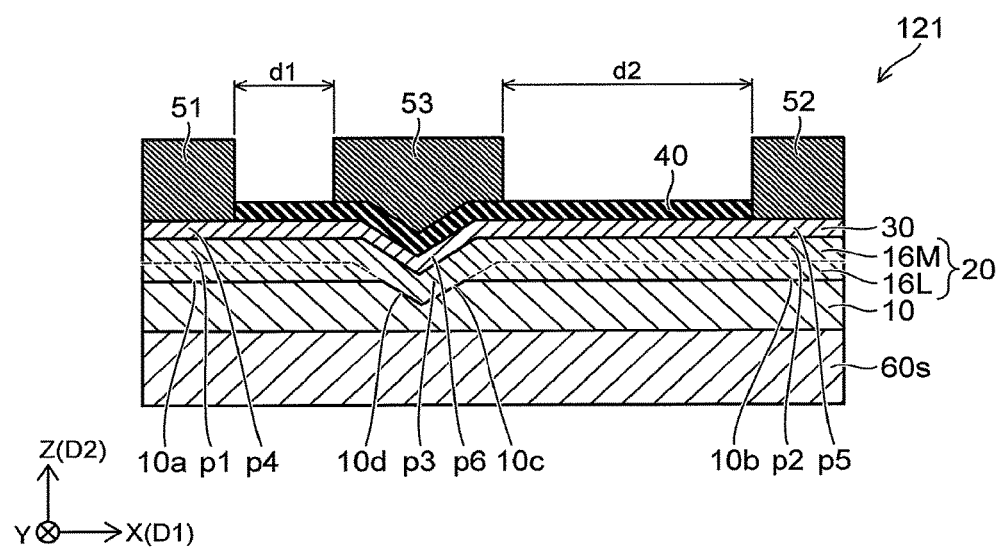
FIG. 30 is a schematic cross-sectional view illustrating another semiconductor device according to the fourth embodiment.

FIG. 30 is a schematic cross-sectional view illustrating another semiconductor device according to the fourth embodiment.

As shown in FIG. 30, the semiconductor device 121 according to the fourth embodiment also includes the first electrode 51, the second electrode 52, the third electrode 53, the first layer 10, the second layer 20, the third layer 30, and the insulating layer 40. In the semiconductor device 121, the first layer 10 has the first surface 10a, the second surface 10b, the third surface 10c, and the fourth surface 10d. In the semiconductor device 121, the second layer 20 includes the first low-Al-concentration film 16L and the second low-Al-concentration film 16M. Otherwise, the configuration of the semiconductor device 121 is similar to that of the semiconductor device 120.

In the example as well, the first layer 10 includes at least one of $Al_{x1}Ga_{1-x1}N$ ($0<x1<1$) or p-type $Al_{z1}Ga_{1-z1}N$ ($0 \le z1<1$). The second layer 20 includes $Al_{x2}Ga_{1-x2}N$ ($0 \le x2 < 1$ and $x2 < x1$). The third layer 30 includes $Al_{x3}Ga_{1-x3}N$ ($0 < x3 < 1$ and $x2 < x3$).

The first low-Al-concentration film 16L includes, for example, $Al_{x2}Ga_{1-x2}N$ ($0 \le x21 < 1$ and $x21 < x1$). The second low-Al-concentration film 16M includes $Al_{x22}Ga_{1-x22}N$ ($0 \le x22 < 1$ and $x22 < x1$). In the third layer 30, the composition ratio x3 is higher than the composition ratio x21 and higher than the composition ratio x22.

In the second layer 20, the first partial region p1 includes a portion of the first low-Al-concentration film 16L and a portion of the second low-Al-concentration film 16M. The second partial region p2 includes another portion of the first low-Al-concentration film 16L and another portion of the second low-Al-concentration film 16M. The third partial region p3 includes yet another portion of the second low-Al-concentration film 16M.

In the semiconductor device 121 as well, the polarization weakens; and a high threshold is obtained. The good characteristics of a normally-off characteristic (a high threshold) and a low on-resistance are obtained.

FIG. 31 to FIG. 34 are schematic cross-sectional views illustrating another method for manufacturing the semiconductor device according to the fourth embodiment.

Figure 31:
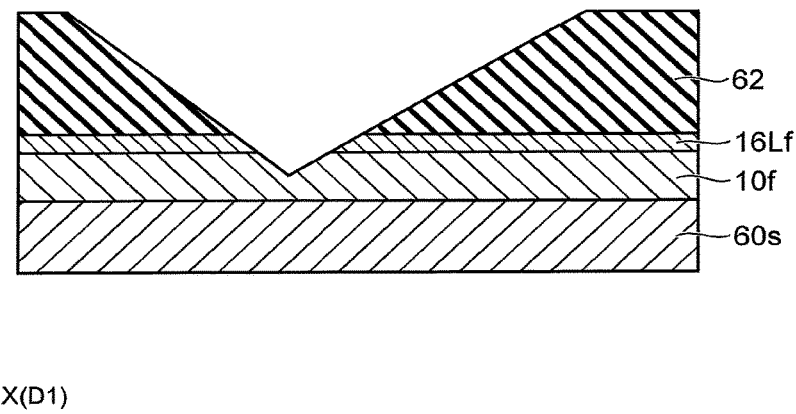
FIG. 31 is a schematic cross-sectional view illustrating another method for manufacturing the semiconductor device according to the fourth embodiment.

As shown in FIG. 31, the first film 10f that is used to form the first layer 10 is formed on the substrate 60s (e.g., the silicon substrate); a film 16Lf that is used to form the first low-Al-concentration film 16L is formed on the first film 10f; and the mask layer 62 is formed on the film 16Lf. At the opening of the mask layer 62, the first film 10f and a portion of the film 16Lf are removed; and the recess 10D is formed. The recess 10D has a tilted surface. Thereby, the first layer 10 and the first low-Al-concentration film 16L are obtained.

Figure 32:
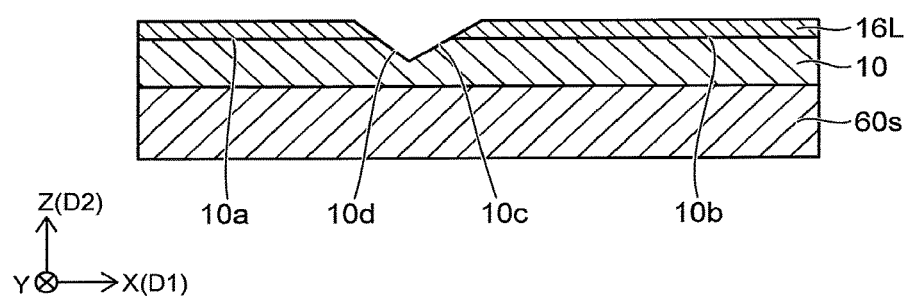
FIG. 32 is a schematic cross-sectional view illustrating another method for manufacturing the semiconductor device according to the fourth embodiment.

As shown in FIG. 32, the first layer 10 has the first surface 10a, the second surface 10b, the third surface 10c, and the fourth surface 10d. A portion of the first low-Al-concentration film 16L remains on the first surface 10a. Another portion of the first low-Al-concentration film 16L remains on the second surface 10b.

Figure 33:
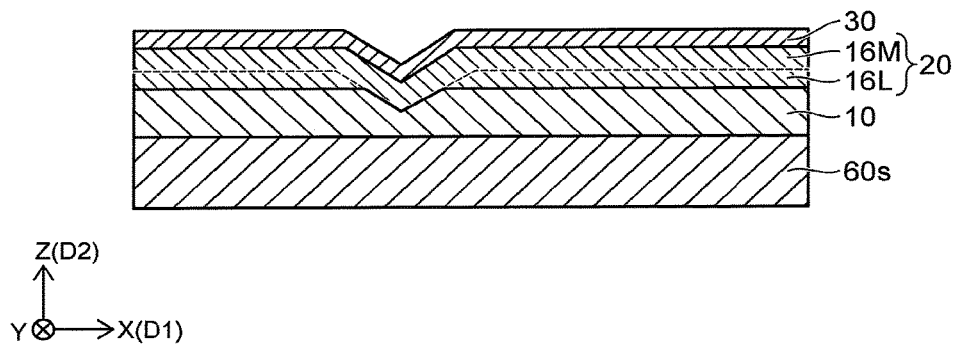
FIG. 33 is a schematic cross-sectional view illustrating another method for manufacturing the semiconductor device according to the fourth embodiment.

As shown in FIG. 33, the second low-Al-concentration film 16M and the third layer 30 are formed. The first low-Al-concentration film 16L and the second low-Al-concentration film 16M are used to form the second layer 20.

Figure 34:
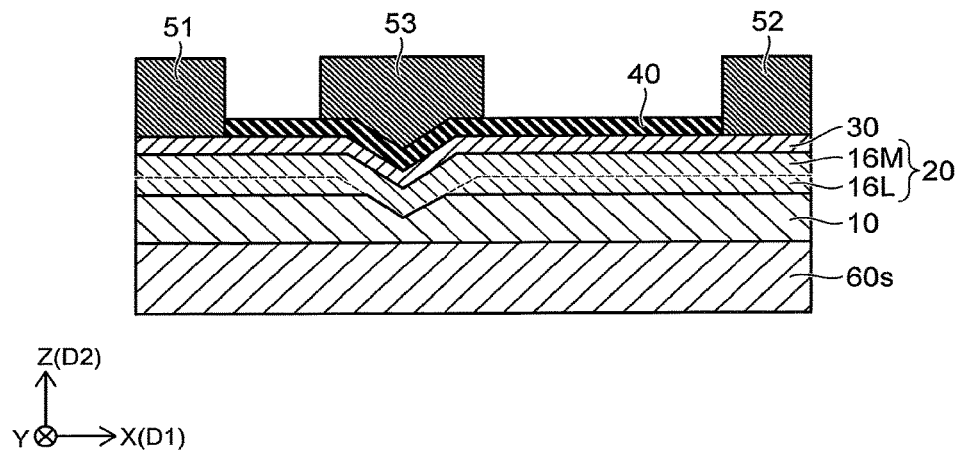
FIG. 34 is a schematic cross-sectional view illustrating another method for manufacturing the semiconductor device according to the fourth embodiment.

As shown in FIG. 34, the insulating layer 40, the first electrode 51, the second electrode 52, and the third electrode 53 are formed. Thereby, the semiconductor device 121 is obtained.

Fifth Embodiment

Figure 35:
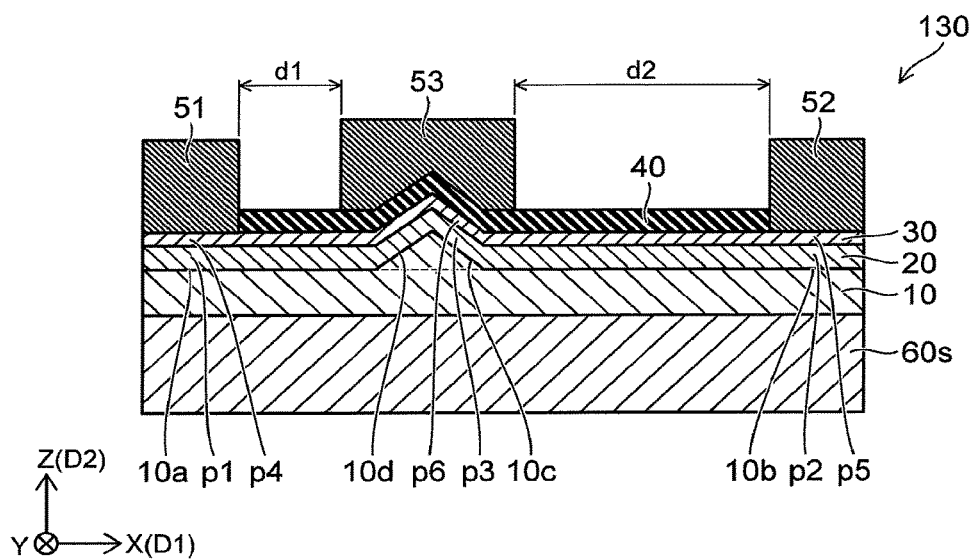
FIG. 35 is a schematic cross-sectional view illustrating a semiconductor device according to a fifth embodiment.

FIG. 35 is a schematic cross-sectional view illustrating a semiconductor device according to a fifth embodiment.

As shown in FIG. 35, the semiconductor device 130 according to the fifth embodiment also includes the first electrode 51, the second electrode 52, the third electrode 53, the first layer 10, the second layer 20, the third layer 30, and the insulating layer 40. In the semiconductor device 130 as well, the first layer 10 has the first surface 10a, the second surface 10b, the third surface 10c, and the fourth surface 10d. In the semiconductor device 130, the third surface 10c and the fourth surface 10d are a convex surface of the first layer 10. Otherwise, the configuration of the semiconductor device 130 is similar to that of the semiconductor device 130.

In the semiconductor device 130 as well, the polarization weakens in the region between the third surface 10c and the third electrode 53 and between the fourth surface 10d and the third electrode 53. Thereby, a high threshold is obtained.

For example, the second layer 20 and the third layer 30 bend greatly at the boundary portion between the third surface 10c and the fourth surface 10d. The threshold easily increases further.

A strong polarization acts at the vicinity of the first electrode 51 and the vicinity of the second electrode 52. Thereby, the resistance is low. A high threshold and a low on-resistance are obtained. The good characteristics of a normally-off characteristic (a high threshold) and a low on-resistance are obtained.

In the semiconductor device 130, the first electrode 51 overlaps at least a portion of the third layer 30 in the first direction D1 (the X-axis direction). The second electrode 52 also overlaps at least a portion of the third layer 30 in the first direction D1.

FIG. 36 to FIG. 39 are schematic cross-sectional views illustrating another method for manufacturing the semiconductor device according to the fifth embodiment.

Figure 36:
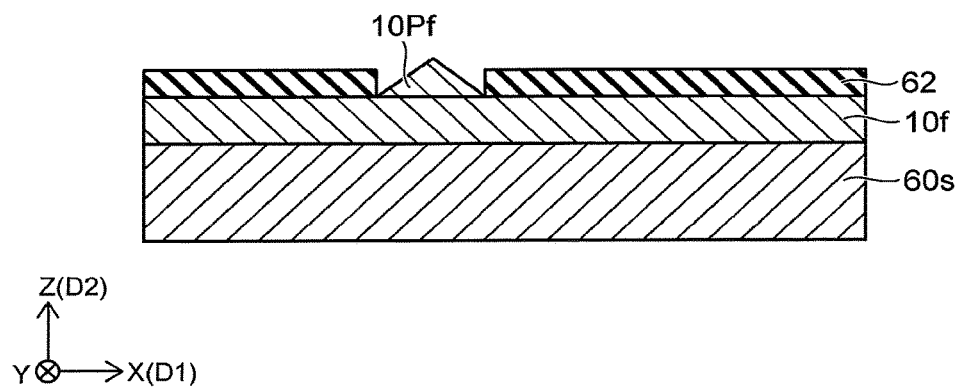
FIG. 36 is a schematic cross-sectional view illustrating another method for manufacturing the semiconductor device according to the fifth embodiment.

As shown in FIG. 36, the first film 10f that is used to form a portion of the first layer 10 is formed on the substrate 60s (e.g., the silicon substrate); and the mask layer 62 is formed on the first film 10f. At the opening of the mask layer 62, a protrusion film 10Pf that is used to form a portion of the first layer 10 is grown. The protrusion film 10Pf has a tilted surface. The first film 10f and the protrusion film 10Pf are used to form the first layer 10.

Figure 37:
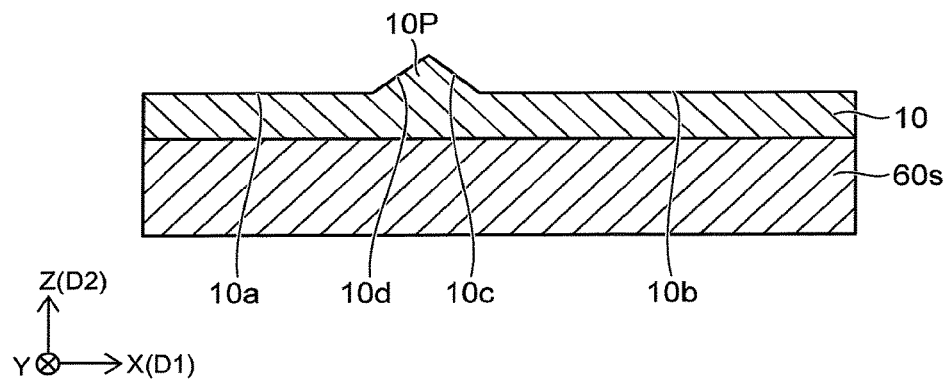
FIG. 37 is a schematic cross-sectional view illustrating another method for manufacturing the semiconductor device according to the fifth embodiment.

As shown in FIG. 37, the first layer 10 has the first surface 10a, the second surface 10b, the third surface 10c, and the fourth surface 10d.

Figure 38:
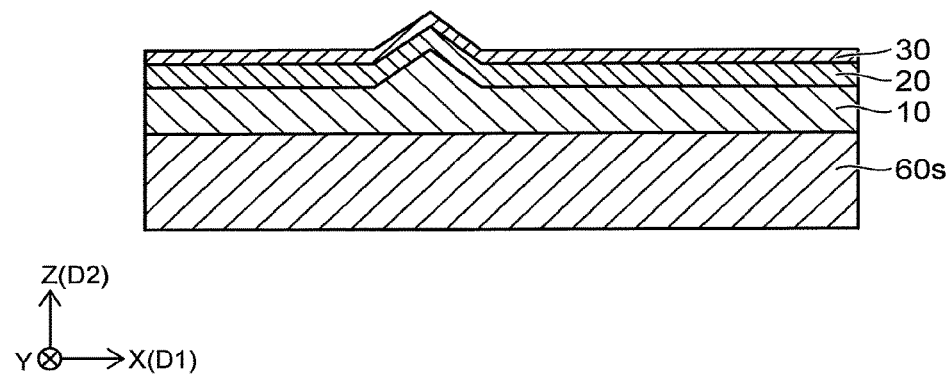
FIG. 38 is a schematic cross-sectional view illustrating another method for manufacturing the semiconductor device according to the fifth embodiment.

As shown in FIG. 38, the second layer 20 and the third layer 30 are formed.

Figure 39:
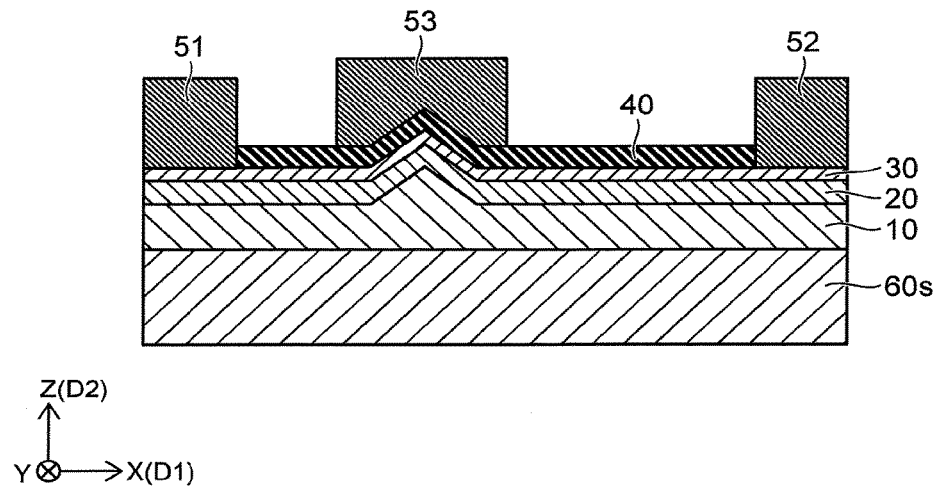
FIG. 39 is a schematic cross-sectional view illustrating another method for manufacturing the semiconductor device according to the fifth embodiment.

As shown in FIG. 39, the insulating layer 40, the first electrode 51, the second electrode 52, and the third electrode 53 are formed. Thereby, the semiconductor device 130 is obtained.

Figure 40:
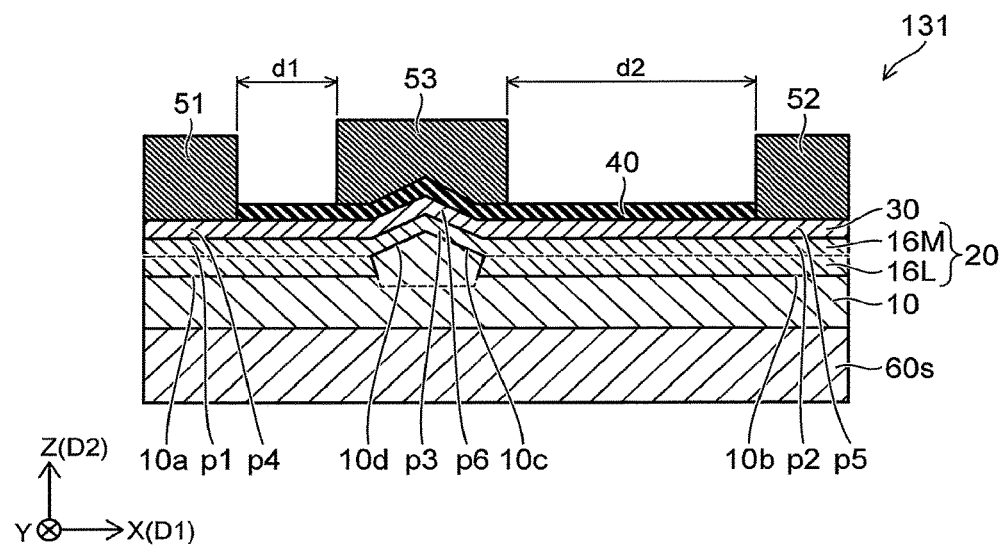
FIG. 40 is a schematic cross-sectional view illustrating another semiconductor device according to the fifth embodiment.

FIG. 40 is a schematic cross-sectional view illustrating another semiconductor device according to the fifth embodiment.

As shown in FIG. 40, the semiconductor device 131 according to the fourth embodiment also includes the first electrode 51, the second electrode 52, the third electrode 53, the first layer 10, the second layer 20, the third layer 30, and the insulating layer 40. In the semiconductor device 131, the first layer 10 has the first surface 10a, the second surface 10b, the third surface 10c, and the fourth surface 10d. In the semiconductor device 131, the second layer 20 includes the first low-Al-concentration film 16L and the second low-Al-concentration film 16M. Otherwise, the configuration of the semiconductor device 131 is similar to that of the semiconductor device 130.

In the example as well, the first layer 10 includes at least one of $Al_{x1}Ga_{1-x1}N$ ($0 < x1 < 1$) or p-type $Al_{z1}Ga_{1-z1}N$ ($0 \le z1 < 1$). The second layer 20 includes $Al_{x2}Ga_{1-x2}N$ ($0 \le x2 < 1$ and $x2 < x1$). The third layer 30 includes $Al_{x3}Ga_{1-x3}N$ ($0 < x3 < 1$ and $x2 < x3$).

The first low-Al-concentration film 16L includes, for example, $Al_{x2}Ga_{1-x2}N$ ($0 \le x21 < 1$ and $x21 < x1$). The second low-Al-concentration film 16M includes $Al_{x22}Ga_{1-x22}N$ ($0 \le x22 < 1$ and $x22 < x1$). In the third layer 30, the composition ratio x3 is higher than the composition ratio x21 and higher than the composition ratio x22.

In the second layer 20, the first partial region p1 includes a portion of the first low-Al-concentration film 16L and a portion of the second low-Al-concentration film 16M. The second partial region p2 includes another portion of the first low-Al-concentration film 16L and another portion of the second low-Al-concentration film 16M. The third partial region p3 includes yet another portion of the second low-Al-concentration film 16M.

In the example, the third surface 10c and the fourth surface 10d are provided at a protrusion 10P of the first layer 10. In the example, the third surface 10c is positioned between the third electrode 53 and a portion of the first low-Al-concentration film 16L in the second direction D2 (the Z-axis direction). The fourth surface 10d is positioned between the third electrode 53 and another portion of the first low-Al-concentration film 16L in the second direction D2.

In the semiconductor device 131 as well, the polarization weakens; and a high threshold is obtained. The good characteristics of a normally-off characteristic (a high threshold) and a low on-resistance are obtained.

In the semiconductor device 131, the first electrode 51 overlaps at least a portion of the third layer 30 in the first direction D1 (the X-axis direction). The second electrode 52 also overlaps at least a portion of the third layer 30 in the first direction D1.

In the semiconductor devices 120, 121, 130, and 131 as well, for example, the third thickness t3 is thinner than the first thickness t1. The third thickness t3 is thinner than the second thickness t2. The threshold increases further.

The embodiments may include the following configurations (e.g., technological proposals).

Configuration 1

A semiconductor device, comprising:
a first electrode;
a second electrode;
a third electrode, a position of the third electrode in a first direction being between a position of the first electrode in the first direction and a position of the second electrode in the first direction;
a first layer including at least one of $Al_{x1}Ga_{1-x1}N$ ($0<x1<1$) or p-type $Al_{z1}Ga_{1-z1}N$ ($0 \leq z1<1$) and having a first surface, a second surface, and a third surface, the first surface being separated from the first electrode in a second direction crossing the first direction, the second surface being separated from the second electrode in the second direction and aligned with a first plane including the first surface, the third surface being separated from the third electrode in the second direction and tilted with respect to the first plane;
a second layer including $Al_{x2}Ga_{1-x2}N$ ($0 \leq x2<1$ and $x2<x1$) and including the first partial region, a second partial region, and a third partial region, the first partial region being provided between the first electrode and the first surface in the second direction, the second partial region being provided between the second electrode and the second surface in the second direction, the third partial region being provided between the third electrode and the third surface in the second direction;
a third layer including $Al_{x3}Ga_{1-x3}N$ ($0<x3<1$ and $x2<x3$) and including a fourth partial region, a fifth partial region, and a sixth partial region, the fourth partial region being provided between the first electrode and the first partial region in the second direction, the fifth partial region being provided between the second electrode and the second partial region in the second direction, the sixth partial region being provided between the third electrode and the third partial region in the second direction, the fourth partial region being electrically connected to the first electrode, the fifth partial region being electrically connected to the second electrode; and
an insulating layer provided between the third electrode and the sixth partial region in the second direction.

Configuration 2

A semiconductor device, comprising:
a first electrode;
a second electrode;
a third electrode, a position of the third electrode in a first direction being between a position of the first electrode in the first direction and a position of the second electrode in the first direction;
a first layer,
the first layer including
a first semiconductor region including at least one of $Al_{y1}Ga_{1-y1}N$ ($0<y1<1$) or p-type $Al_{z1}Ga_{1-z1}N$ ($0 \leq z1<1$),
a second semiconductor region including at least one of $Al_{y2}Ga_{1-y2}N$ ($0<y2<1$) or p-type $Al_{z2}Ga_{1-z2}N$ ($0 \leq z2<1$), and
a third semiconductor region including $Al_{y3}Ga_{1-y3}N$ ($0 \leq y3<1$, $y3<y1$, and $y3<y2$),
at least a portion of the second semiconductor region being positioned between the second electrode and a portion of the first semiconductor region in a second direction crossing the first direction,
a portion of the third semiconductor region being positioned between the portion of the first semiconductor region and the at least a portion of the second semiconductor region in the second direction,
another portion of the third semiconductor region being positioned between the third electrode and another portion of the first semiconductor region in the second direction,
the first semiconductor region having a first surface separated from the first electrode in the second direction,
the second semiconductor region having a second surface separated from the second electrode in the second direction and aligned with a first plane including the first surface,
the third semiconductor region having a third surface separated from the third electrode in the second direction and tilted with respect to the first plane;
a second layer including $Al_{x2}Ga_{1-x2}N$ ($0 \leq x2<1$, $x2<y1$, and $x2<y2$) and including a first partial region, a second partial region, and a third partial region, the first partial region being provided between the first electrode and the first surface in the second direction, the second partial region being provided between the second electrode and the second surface in the second direction, the third partial region being provided between the third electrode and the third surface in the second direction;
a third layer including $Al_{x3}Ga_{1-x3}N$ ($0<x3<1$, $x2<x3$, and $y3<x3$) and including a fourth partial region, a fifth partial region, and a sixth partial region, the fourth partial region being provided between the first electrode and the first partial region in the second direction, the fifth partial region being provided between the second electrode and the second partial region in the second direction, the sixth partial region being provided between the third electrode and the third partial region in the second direction, the fourth partial region being electrically connected to the first electrode, the fifth partial region being electrically connected to the second electrode; and
an insulating layer provided between the third electrode and the sixth partial region in the second direction.

Configuration 3
   A semiconductor device, comprising:
   a first electrode;
   a second electrode;
   a third electrode, a position of the third electrode in a first direction being between a position of the first electrode in the first direction and a position of the second electrode in the first direction;
   a first layer,
   the first layer including
      a first semiconductor region including at least one of $Al_{y1}Ga_{1-y1}N$ ($0<y1<1$) or p-type $Al_{z1}Ga_{1-z1}N$ ($0 \le z1<1$), and
      a second semiconductor region including at least one of $Al_{y2}Ga_{1-y2}N$ ($0<y2<1$) or p-type $Al_{z2}Ga_{1-z2}N$ ($0 \le z2<1$),
   a portion of the second semiconductor region being positioned between the second electrode and a portion of the first semiconductor region in a second direction crossing the first direction,
   another portion of the second semiconductor region being positioned between the third electrode and another portion of the first semiconductor region in the second direction,
   the first semiconductor region having a first surface separated from the first electrode in the second direction,
   the portion of the second semiconductor region having a second surface separated from the second electrode in the second direction and aligned with a first plane including the first surface,
   the other portion of the second semiconductor region having a third surface separated from the third electrode in the second direction and tilted with respect to the first plane;
   a second layer including $Al_{x2}Ga_{1-x2}N$ ($0 \le x2<1$, $x2<y1$, and $x2<y2$) and including the first partial region, a second partial region, and a third partial region, the first partial region being provided between the first electrode and the first surface in the second direction, the second partial region being provided between the second electrode and the second surface in the second direction, the third partial region being provided between the third electrode and the third surface in the second direction;
   a third layer including $Al_{x3}Ga_{1-x3}N$ ($0<x3<1$ and $x2<x3$) and including a fourth partial region, a fifth partial region, and a sixth partial region, the fourth partial region being provided between the first electrode and the first partial region in the second direction, the fifth partial region being provided between the second electrode and the second partial region in the second direction, the sixth partial region being provided between the third electrode and the third partial region in the second direction, the fourth partial region being electrically connected to the first electrode, the fifth partial region being electrically connected to the second electrode; and
   an insulating layer provided between the third electrode and the sixth partial region in the second direction.
Configuration 4
   The semiconductor device according to any one of Configurations 1 to 3, wherein the absolute value of the angle between the first surface and the c-plane of the first layer is less than the absolute value of the angle between the third surface and the c-plane.
Configuration 5
   The semiconductor device according to any one of Configurations 1 to 3, wherein
the first surface and the second surface are aligned with the c-plane of the first layer, and
   the third surface is tilted with respect to the c-plane.
Configuration 6
   The semiconductor device according to any one of Configurations 1 to 3, wherein
   the absolute value of the angle between the first surface and the c-plane of the first layer is 5 degrees or less, and
   the absolute value of the angle between the third surface and the c-plane of the first layer is not less than 10 degrees and not more than 80 degrees.
Configuration 7
   The semiconductor device according to any one of Configurations 1 to 6, wherein
   the third electrode has a third electrode surface opposing the insulating layer, and
   the third electrode surface is aligned with a third plane including the third surface.
Configuration 8
   The semiconductor device according to any one of Configurations 1 to 6, wherein
   the insulating layer has a first insulating layer surface opposing the third surface, and
   the first insulating layer surface is aligned with a third plane including the third surface.
Configuration 9
   The semiconductor device according to Configuration 8, wherein
   the insulating layer has a second insulating layer surface opposing the third electrode, and
   the second insulating layer surface is aligned with the third plane.
Configuration 10
   The semiconductor device according to any one of Configurations 1 to 6, wherein
   the third layer has a third layer surface opposing the third surface, and
   the third layer surface is aligned with a third plane including the third surface.
Configuration 11
   The semiconductor device according to any one of Configurations 1 to 6, wherein
   the second layer has a second layer surface opposing the third surface, and
   the second layer surface is aligned with a third plane including the third surface.
Configuration 12
   The semiconductor device according to any one of Configurations 1 to 11, wherein a third thickness of the third partial region along a third direction perpendicular to the third surface is thinner than a second thickness of the second partial region along the second direction.
Configuration 13
   The semiconductor device according to Configuration 12, wherein the third thickness is thinner than the second thickness of the second partial region along the second direction.
Configuration 14
   The semiconductor device according to any one of Configurations 1 to 13, wherein a position of the third surface in the second direction is between a position of the first surface in the second direction and a position of the second surface in the second direction.
Configuration 15
   The semiconductor device according to any one of Configurations 1 to 14, wherein the first electrode overlaps at least a portion of the third layer in the first direction.

Configuration 16

The semiconductor device according to any one of Configurations 1 to 15, wherein the second electrode overlaps at least a portion of the third layer in the first direction.

Configuration 17

The semiconductor device according to any one of Configurations 1 to 16, wherein the third partial region is between, in the first direction, two portions included in the first layer.

Configuration 18

A method for manufacturing a semiconductor device, comprising:

forming a first layer including at least one of $Al_{x1}Ga_{1-x1}N$ ($0<x1<1$) or p-type $Al_{z1}Ga_{1-z1}N$ ($0 \leq z1<1$), the first layer having a first surface, a second surface, and a third surface, the second surface being aligned with a first plane including the first surface, the third surface being tilted with respect to the first surface, a position of the third surface in a first direction being between a position of the first surface in the first direction and a position of the second surface in the first direction, the first direction being aligned with the first surface;

forming a second layer including $Al_{x2}Ga_{1-x2}N$ ($0 \leq x2<1$ and $x2<x1$) on the first layer;

forming a third layer including $Al_{x3}Ga_{1-x3}N$ ($0<x3<1$ and $x2<x3$) on the second layer;

forming an insulating layer on a portion of the third layer, the portion of the third layer overlapping the third surface in a second direction crossing the first surface; and forming a first electrode, a second electrode, and a third electrode, the first electrode overlapping the first surface in the second direction and being electrically connected to another portion of the third layer, the second electrode overlapping the second surface in the second direction and being electrically connected to yet another portion of the third layer, the third electrode being positioned on the insulating layer.

Configuration 19

A method for manufacturing a semiconductor device, comprising:

forming a stacked film,
the stacked film including
a first semiconductor film including at least one of $Al_{y1}Ga_{1-y1}N$ ($0<y1<1$) or p-type $Al_{z1}Ga_{1-z1}N$ ($0 \leq z1<1$),
a second semiconductor film including at least one of $Al_{y2}Ga_{1-y2}N$ ($0<y2<1$) or p-type $Al_{z2}Ga_{1-z2}N$ ($0 \leq z2<1$),
a third semiconductor film including $Al_{y3}Ga_{1-y3}N$ ($0 \leq y3<1$, $y3<y1$, and $y3<y2$), and
a fourth semiconductor film including $Al_{y4}Ga_{1-y4}N$ ($0 \leq y4<1$, $y4<y1$, and $y4<y2$),
the third semiconductor film being on the first semiconductor film, the second semiconductor film being on the third semiconductor film, the fourth semiconductor film being on the second semiconductor film;

exposing a portion of the third semiconductor film by removing a portion of the fourth semiconductor film and a portion of the second semiconductor film, the first semiconductor film having a first surface, a remaining portion of the second semiconductor film having a second surface and a third surface, a position of the third surface in a first direction being between a position of the first surface in the first direction and a position of the second surface in the first direction, the first direction being aligned with the first surface, the first surface overlapping the portion of the third semiconductor film in a second direction crossing the first direction, the second surface being aligned with a first plane including the first surface, the third surface being tilted with respect to the first plane;

forming a second partial layer including $Al_{x2}Ga_{1-x2}N$ ($0 \leq x2<1$, $x2<y1$, and $x2<y2$) on the first surface, the third surface, and a remaining portion of the fourth semiconductor film;

forming a third layer including $Al_{x3}Ga_{1-x3}N$ ($0<x3<1$ and $x2<x3$) on the second layer;

forming an insulating layer on a portion of the third layer, the portion of the third layer overlapping the third surface in the second direction; and forming a first electrode, a second electrode, and a third electrode, the first electrode overlapping the first surface in the second direction and being electrically connected to another portion of the third layer, the second electrode overlapping the second surface in the second direction and being electrically connected to yet another portion of the third layer, the third electrode being positioned on the insulating layer.

Configuration 20

A method for manufacturing a semiconductor device, comprising:

forming a second semiconductor film including at least one of $Al_{y2}Ga_{1-y2}N$ ($0<y2<1$ and $y5<y2$) or p-type $Al_{z2}Ga_{1-z2}N$ ($0 \leq z2<1$) on a second portion of a stacked film, the stacked film including a first semiconductor film and a first low-Al-concentration film, the first semiconductor film including at least one of $Al_{y1}Ga_{1-y1}N$ ($0<y1<1$) or p-type $Al_{z1}Ga_{1-z1}N$ ($0 \leq z1<1$) and including a first portion and the second portion, a direction from the first portion toward the second portion being aligned with a first direction, the first low-Al-concentration film including $Al_{y5}Ga_{1-y5}N$ ($0 \leq y5<1$ and $y5<y1$) and being provided on a first surface of the first portion, the second semiconductor film having a second surface and a third surface, the second surface being aligned with a first plane including the first surface, the third surface being tilted with respect to the first plane, a position of the third surface in the first direction being between a position of the first surface in the first direction and a position of the second surface in the first direction, the first direction being aligned with the first surface;

forming a second low-Al-concentration film including $Al_{y3}Ga_{1-y3}N$ ($0 \leq y3<1$, $y3<y1$, and $y3<y2$) on the second surface;

forming a second partial layer including $Al_{x2}Ga_{1-x2}N$ ($0 \leq x2<1$, $x2<y1$, and $x2<y2$) on the first low-Al-concentration film, the third surface, and the second low-Al-concentration film;

forming a third layer including $Al_{x3}Ga_{1-x3}N$ ($0<x3<1$ and $x2<x3$) on the second partial layer;

forming an insulating layer on a portion of the third layer, the portion of the third layer overlapping the third surface in a second direction crossing the first surface; and forming a first electrode, a second electrode, and a third electrode, the first electrode overlapping the first surface in the second direction and being electrically connected to another portion of the third layer, the second electrode overlapping the second surface in the second direction and being electrically connected to yet another portion of the third layer, the third electrode being positioned on the insulating layer.

According to the embodiments, a semiconductor device and a method for manufacturing the semiconductor device can be provided in which a high threshold can be obtained.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, layers, semiconductor films, insulating layers, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods for manufacturing the same practicable by an appropriate design modification by one skilled in the art based on the semiconductor devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode;
a third electrode, a position of the third electrode in a first direction being between a position of the first electrode in the first direction and a position of the second electrode in the first direction;
a first layer including at least one of $Al_{x1}Ga_{1-x1}N$ ($0<x1<1$) or p-type $Al_{z1}Ga_{1-z1}N$ ($0 \leq z1 < 1$) and having a first surface, a second surface, and a third surface, the first surface being separated from the first electrode in a second direction crossing the first direction, the second surface being separated from the second electrode in the second direction and aligned with a first plane including the first surface, the third surface being separated from the third electrode in the second direction and tilted with respect to the first plane;
a second layer including $Al_{x2}Ga_{1-x2}N$ ($0 \leq x2 < 1$ and $x2 < x1$) and including a first partial region, a second partial region, and a third partial region, the first partial region being provided between the first electrode and the first surface in the second direction, the second partial region being provided between the second electrode and the second surface in the second direction, the third partial region being provided between the third electrode and the third surface in the second direction;
a third layer including $Al_{x3}Ga_{1-x3}N$ ($0<x3<1$ and $x2<x3$) and including a fourth partial region, a fifth partial region, and a sixth partial region, the fourth partial region being provided between the first electrode and the first partial region in the second direction, the fifth partial region being provided between the second electrode and the second partial region in the second direction, the sixth partial region being provided between the third electrode and the third partial region in the second direction, the fourth partial region being electrically connected to the first electrode, the fifth partial region being electrically connected to the second electrode; and
an insulating layer provided between the third electrode and the sixth partial region in the second direction.

2. The device according to claim 1, wherein an absolute value of an angle between the first surface and a c-plane of the first layer is less than an absolute value of an angle between the third surface and the c-plane.

3. The device according to claim 1, wherein
the first surface and the second surface are aligned with a c-plane of the first layer, and
the third surface is tilted with respect to the c-plane.

4. The device according to claim 1, wherein
an absolute value of an angle between the first surface and a c-plane of the first layer is 5 degrees or less, and
an absolute value of an angle between the third surface and the c-plane of the first layer is not less than 10 degrees and not more than 80 degrees.

5. The device according to claim 1, wherein
the third electrode has a third electrode surface opposing the insulating layer, and
the third electrode surface is aligned with a third plane including the third surface.

6. The device according to claim 1, wherein
the insulating layer has a first insulating layer surface opposing the third surface, and
the first insulating layer surface is aligned with a third plane including the third surface.

7. The device according to claim 6, wherein
the insulating layer has a second insulating layer surface opposing the third electrode, and
the second insulating layer surface is aligned with the third plane.

8. The device according to claim 1, wherein
the third layer has a third layer surface opposing the third surface, and
the third layer surface is aligned with a third plane including the third surface.

9. The device according to claim 1, wherein
the second layer has a second layer surface opposing the third surface, and
the second layer surface is aligned with a third plane including the third surface.

10. The device according to claim 1, wherein a third thickness of the third partial region along a third direction perpendicular to the third surface is thinner than a second thickness of the second partial region along the second direction.

11. The device according to claim 10, wherein the third thickness is thinner than a first thickness of the first partial region along the second direction.

12. The device according to claim 1, wherein a position of the third surface in the second direction is between a position of the first surface in the second direction and a position of the second surface in the second direction.

13. The device according to claim 1, wherein the first electrode overlaps at least a portion of the third layer in the first direction.

14. The device according to claim 1, wherein the second electrode overlaps at least a portion of the third layer in the first direction.

15. The device according to claim 1, wherein the third partial region is between, in the first direction, two portions included in the first layer.

* * * * *